United States Patent
Chen et al.

(10) Patent No.: US 10,153,218 B2
(45) Date of Patent: Dec. 11, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Tsung-Yu Chen, Hsinchu (TW); Wensen Hung, Hsinchu County (TW); Hung-Chi Li, Taipei (TW); Cheng-Chieh Hsieh, Tainan (TW); Tung-Liang Shao, Hsinchu (TW); Chih-Hang Tung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/434,838

(22) Filed: Feb. 16, 2017

(65) Prior Publication Data

US 2018/0151472 A1    May 31, 2018

Related U.S. Application Data

(60) Provisional application No. 62/427,714, filed on Nov. 29, 2016.

(51) Int. Cl.
*H01L 23/00* (2006.01)
*H01L 23/04* (2006.01)
*H01L 23/367* (2006.01)
*H01L 23/373* (2006.01)

(52) U.S. Cl.
CPC ............ *H01L 23/04* (2013.01); *H01L 23/367* (2013.01); *H01L 23/3731* (2013.01); *H01L 23/3736* (2013.01); *H01L 23/562* (2013.01)

(58) Field of Classification Search
CPC ....... H01L 23/34; H01L 23/36; H01L 23/367; H01L 23/3672; H01L 23/3675; H01L 23/373; H01L 23/3737; H01L 23/04; H01L 23/42
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |

(Continued)

*Primary Examiner* — Armando Rodriguez
(74) *Attorney, Agent, or Firm* — WPAT, P.C., Intellectual Property Attorneys; Anthony King

(57) ABSTRACT

A semiconductor structure includes a die including a surface, a lid disposed over the surface of the die, and a thermally conductive material disposed between the die and the lid, wherein the lid includes a protrusion protruded towards the surface of the die and the thermally conductive material surrounds the protrusion. Also, a method of manufacturing a semiconductor structure includes providing a die including a surface, providing a lid, removing a portion of the lid to form a protrusion, disposing a thermally conductive material between the surface of the die and the lid, wherein the protrusion of the lid is surrounded by the thermally conductive material. Further, an apparatus for manufacturing a semiconductor structure and a method of manufacturing a semiconductor structure by the apparatus are disclosed.

20 Claims, 30 Drawing Sheets

(56) References Cited

U.S. PATENT DOCUMENTS

| | | |
|---|---|---|
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2010/0181644 A1* | 7/2010 | Toong .................. H01L 23/367 257/532 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0187679 A1* | 7/2015 | Ho ...................... H01L 21/4803 257/690 |
| 2015/0287697 A1 | 10/2015 | Tsai et al. |
| 2015/0348872 A1 | 12/2015 | Kuo et al. |

\* cited by examiner

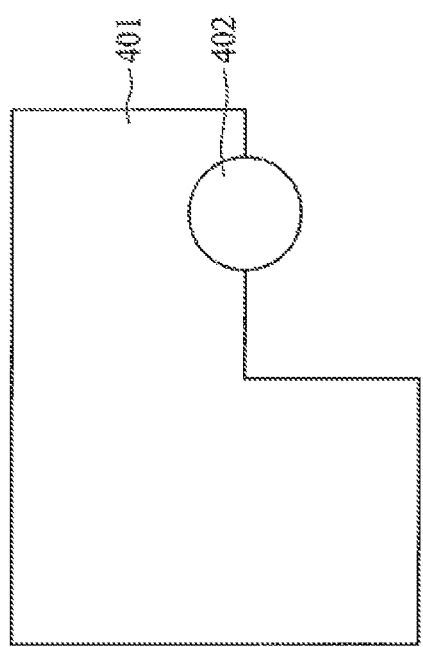

SEMICONDUCTOR STRUCTURE AND MANUFACTURING METHOD THEREOF

PRIORITY CLAIM AND CROSS-REFERENCE

This application claims priority to U.S. provisional application No. 62/427,714, filed on Nov. 29, 2016, entitled "Semiconductor Structure and Manufacturing Method Thereof," which application is hereby incorporated herein by reference.

BACKGROUND

Electronic equipments involving semiconductor devices are indispensable from our daily life. With the advancement of electronic technology, electronic equipments become smaller in size, and thus semiconductor devices inside the electronic equipments are also getting smaller, thinner and lighter. Wafer level packaging (WLP), and chip-on-wafer-on-substrate (CoWoS) technology have been gaining in popularity and is widely applied, and this structural paradigm implies for heat dissipation due to high power density of stacked chips.

Thus, manufacturing of the electronic equipment requires more and more emphasis on thermal management in order to produce the semiconductor devices in the electronic equipments. Therefore, there is a continuous demand on increasing thermal management efficiency, and improving package reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are schematic views illustrating manufacturing a semiconductor structure by a method of FIG. 5 in accordance with some embodiment of the present disclosure.

Figure 1:
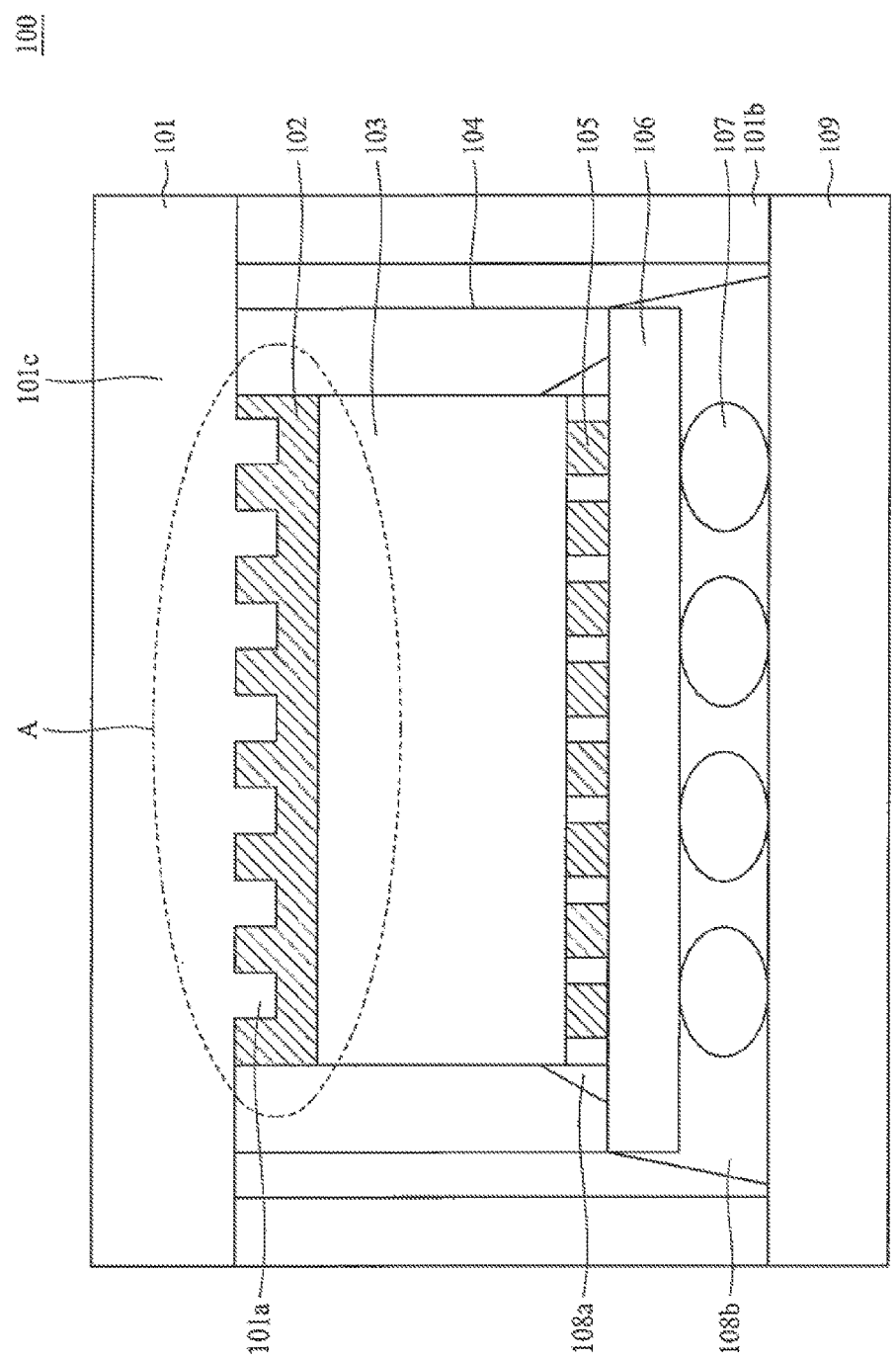
FIG. 1 is a schematic cross-sectional view of an aspect of a semiconductor structure in accordance with some embodiments of the present disclosure.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, especially relative terms, such as "beneath," "below," "lower," "above," "upper" and the like, may be used herein for eases of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the operations of manufacturing the semiconductor structure, the semiconductor structure is assembled with a number of integrated components including various thermal interface materials. The thermal interface materials have been used in semiconductor structure to act as heat spreaders so as to facilitate transfer of heat emanating from the chips. The thermal interface material includes various types of materials such as polymers or metals.

Adhesive thermal interface material or polymeric thermal interface material excels with stronger bonding capability due to desired stickiness, but lags behind other thermal interface material type with respect to poor thermal conductivity. A different story goes for metallic thermal interface material. The metallic thermal interface material provides stronger thermal conductivity, but its adoption in industrial application context suffers from higher manufacturing cost. The undesired configurations of the components and the yield loss of the semiconductor would further lead to material wastage and thus the manufacturing cost would increase. Further, the semiconductor device can even be easily damaged if, for example, the polymer fails with delivering the bonding functionality for keeping the integrity of the semiconductor components together.

In the present disclosure, a semiconductor structure is disclosed. The semiconductor structure includes a die, a lid disposed over the die and a thermally conductive material between the die and the lid. The lid includes a protrusion protruded towards the die, or the die includes a protrusion protruded from the die towards the lid. As such, thermal dissipation from the die to the lid would be increased, and adhesion between the die and the lid by the thermally conductive material would be improved. Further, the thermally conductive material includes metallic and polymeric materials, and particularly the metallic thermally conductive material is disposed over the die and the polymeric thermally conductive material is disposed over the lid to improve the heat dissipation from the die to the lid.

FIG. 1 is an aspect of a semiconductor structure 100. In some embodiments, the semiconductor structure 100 is a semiconductor package. In some embodiments, the semiconductor structure 100 is a chip on wafer on substrate (CoWoS) package. In some embodiments, the semiconductor structure 100 includes a substrate 109. In some embodiments, the substrate 109 can be fabricated from, for example, an organic (laminate) material such as bismaleimide-triazine (BT), a polymer-based material such as liquid-crystal polymer (LCP), a ceramic material such as low-temperature co-fired ceramic (LTCC), a silicon or glass interposer, an integrated circuit die, an integrated circuit package, or the like. In some embodiments, the substrate 109 can be a printed circuit board (PCB). In some embodiments, the substrate 109 is a silicon substrate or silicon wafer. In some embodiments, the substrate 109 includes glass or ceramic. In some embodiments, the substrate 109 includes several circuitries and one or more active elements such as transistors etc. disposed over or in the substrate 109. In some embodiments, the substrate 109 is a wafer which would be fabricated to become integrated circuits (IC) in subsequent manufacturing operations. In some embodiments, the substrate 109 is in a rectangular or polygonal shape.

In some embodiments, an interposer 106 is disposed over the substrate 109. In some embodiments, the interposer 106 includes semiconductive materials such as silicon or other suitable materials. In some embodiments, the interposer 106 includes several circuitries and one or more active elements such as transistors etc. disposed over or in the interposer 106. In some embodiments, the interposer 106 includes conductive wire, dielectric material or etc. In some embodiments, the interposer 106 is in a rectangular or polygonal shape. In some embodiments, the interposer 106 has similar configuration as the substrate 109.

In some embodiments, a first conductive bump 107 is disposed between and electrically connected to the substrate 109 and the interposer 106. In some embodiments, the substrate 109 is configured for electrically connecting with the first conductive bump 107. In some embodiments, the first conductive bump 107 includes conductive material such as includes solder, copper, nickel, gold or etc. In some embodiments, the first conductive bump 107 is a solder ball, a ball grid array (BGA) ball, controlled collapse chip connection (C4) bump, microbump, a pillar or the like. In some embodiments, the first conductive bump 107 is in a spherical, hemispherical or cylindrical shape. The first conductive bump 107 is configured to be received by pads on the substrate 109 to electrically connect with a circuitry of the substrate 109. In some embodiments, several first conductive bumps 107 are included. The first conductive bumps 107 are intervally spaced with each other.

In some embodiments, the semiconductor structure 100 includes a die 103. In some embodiments, the die 103 is a piece including semiconductor materials such as silicon, and is fabricated with a predetermined functional circuit within the die 103 produced by photolithography operations. In some embodiments, the die 103 is singulated from a silicon wafer by a mechanical or laser blade and then is placed over the substrate 109. In some embodiments, the die 103 is electrically connected to the interposer 106 or the substrate 109. In some embodiments, the die 103 is in a quadrilateral, a rectangular or a square shape.

In some embodiments, the die 103 and the interposer 106 are electrically connected by a second conductive bump 105. In some embodiments, the second conductive bump 105 is disposed between the die 103 and the interposer 106. In some embodiments, the die 103 and the interposer 106 are bonded by the second conductive bump 105. In some embodiments, the second conductive bump 105 includes conductive material such as includes solder, copper, nickel, gold or etc. In some embodiments, the second conductive bump 105 is a solder ball, a ball grid array (BGA) ball, controlled collapse chip connection (C4) bump, microbump, a pillar or the like. In some embodiments, the second conductive bump 105 is in a spherical, hemispherical or cylindrical shape. In some embodiments, several second conductive bumps 105 are included. The second conductive bumps 105 are intervally spaced with each other.

In some embodiments, the semiconductor structure 100 includes a lid 101 disposed over the die 103. In some embodiments, the lid 101 includes a metallic material such as copper or etc. In some embodiments, the lid 101 can comprise a metal or a metal alloy, with the respective metals selected from the group consisting of aluminum (Al), copper (Cu), nickel (Ni), cobalt (Co) and the like. In some embodiments, the lid 101 can be formed of a composite material selected from the group consisting of silicon carbide, aluminum nitride, graphite, and the like. In some embodiments, the lid 101 can be fabricated by silicon substrate. In some embodiments, the lid 101 is a heat spreader or a heat sink. In some embodiments, the lid 101 is configured to dissipate a heat from the die 103 to ambient environment or surrounding air. In some embodiments, the lid 101 includes a protrusion 101a protruded from the lid 101 towards the die 103. In some embodiments, the lid 101 includes a ring member 101b surrounding the die 103 and a covering member 101c disposed over the die 103 and the ring member 101b. In some embodiments, the ring member 101b is integral with the covering member 101c.

In some embodiments, a thermally conductive material 102 is disposed between the die 103 and the lid 101. In some embodiments, the thermally conductive material 102 is an adhesive. In some embodiments, the thermally conductive material 102 is a thermal interface material (TIM). In some embodiments, the thermally conductive material 102 includes grease based material, phase change material, gels, adhesive, polymeric or metallic material. In some embodiments, the thermally conductive material 102 includes lead tin based solder (PbSn), silver paste (Ag), gold, tin, gallium, indium or etc. In some embodiments, the thermally conductive material 102 is configured to conduct a heat from the die 103 to the lid 101. In some embodiments, the thermally conductive material 102 is disposed over a surface of the die 103. In some embodiments, the thermally conductive material 102 surrounds the protrusion 101a of the lid 101.

In some embodiments, a molding 104 surrounds the die 103. In some embodiments, the molding 104 includes epoxy material. In some embodiments, the molding 104 has a shape of a column extending between the lid 101 and the interposer 106. In some embodiments, the molding 104 surrounds the die 103 and the thermally conductive material 102.

In some embodiments, a first underfill 108b surrounds the first conductive bump 107. In some embodiments, the first underfill 108b is sandwiched between interposer 106 and the substrate 109. In some embodiments, a portion of the first underfill 108b has a tapered shape that tapers towards the substrate 109. In some embodiments, the first underfill 108b encapsulates the first conductive bump 107 and surrounding a portion of the interposer 106. In some embodiments, a portion of a sidewall of the interposer 106 is interfaced with the first underfill 108b.

In some embodiments, a second underfill 108a is formed surrounding the second conductive bump 105. In some embodiments, the second underfill 108a is sandwiched between the die 103, the molding 104, and the interposer 106. In some embodiments, a portion of the second underfill 108a that is disposed adjacent to the die 103, the molding 104, and the interposer 106 has a tapered shape that tapers towards the interposer 106. In some embodiments, the second underfill 108a encapsulates the second conductive bump 105 and surrounding a portion of the die 103. In some embodiments, a portion of a sidewall of the die 103 is interfaced with the second underfill 108a. In some embodiments, a portion of the molding 104 is interfaced with the second underfill 108a.

FIGS. 1A-1H illustrate various configurations of the lid 101, the thermally conductive material 102 and the die 103. FIGS. 1A-1H correspond to the portion A of the semiconductor structure 100 in FIG. 1. FIGS. 1A-1H are enlarged view of the portion A.

Figure 1A:
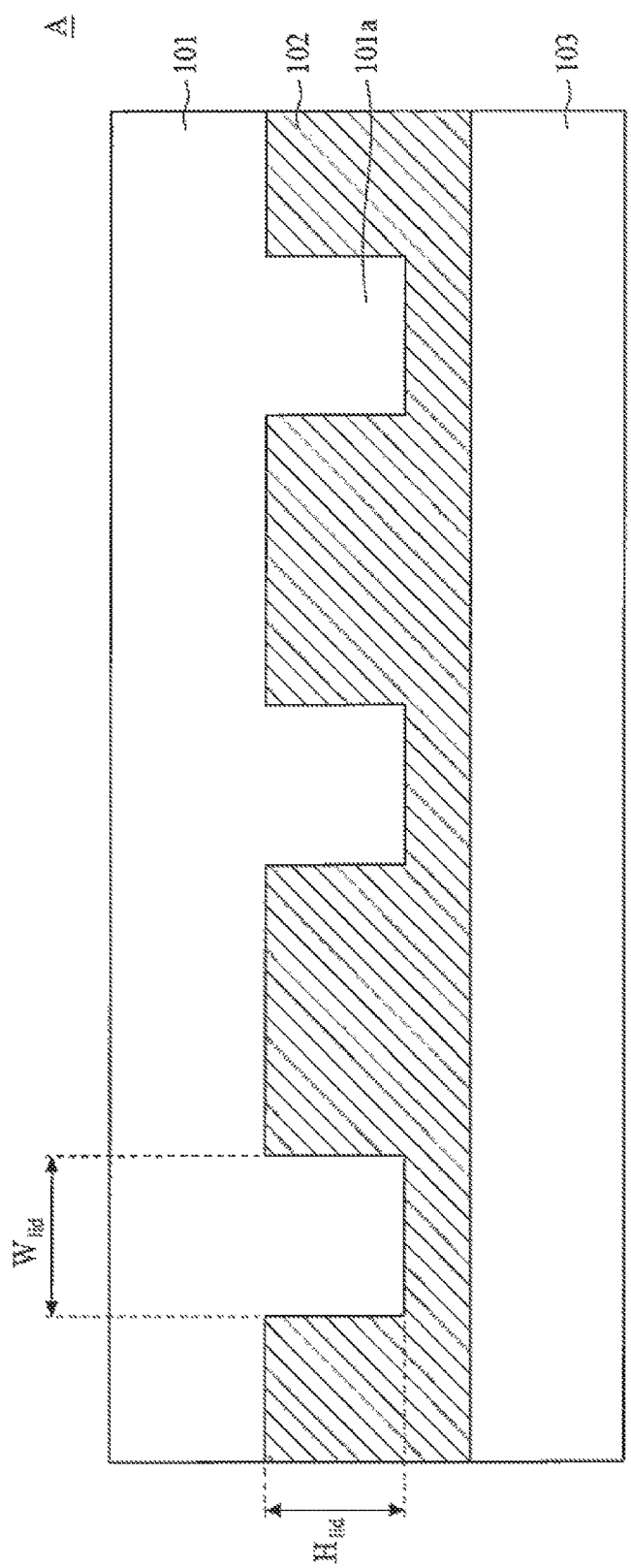
FIGS. 1A-1H are enlarged views of a portion A of the semiconductor structure in FIG. 1 in accordance with some embodiments of the present disclosure.

In some embodiments as shown in FIG. 1A, the lid 101 includes the protrusion 101a protruded towards the surface of the die 103. In some embodiments, the thermally conductive 102 surrounds the protrusion 101a. In some embodiments, a height $H_{lid}$ of the protrusion 101a of the lid 101 is about 50 µm to about 150 µm. In some embodiments, a width $W_{lid}$ of the protrusion of the lid 101 is about 0.1 mm to about 1.5 mm.

Figure 1B:
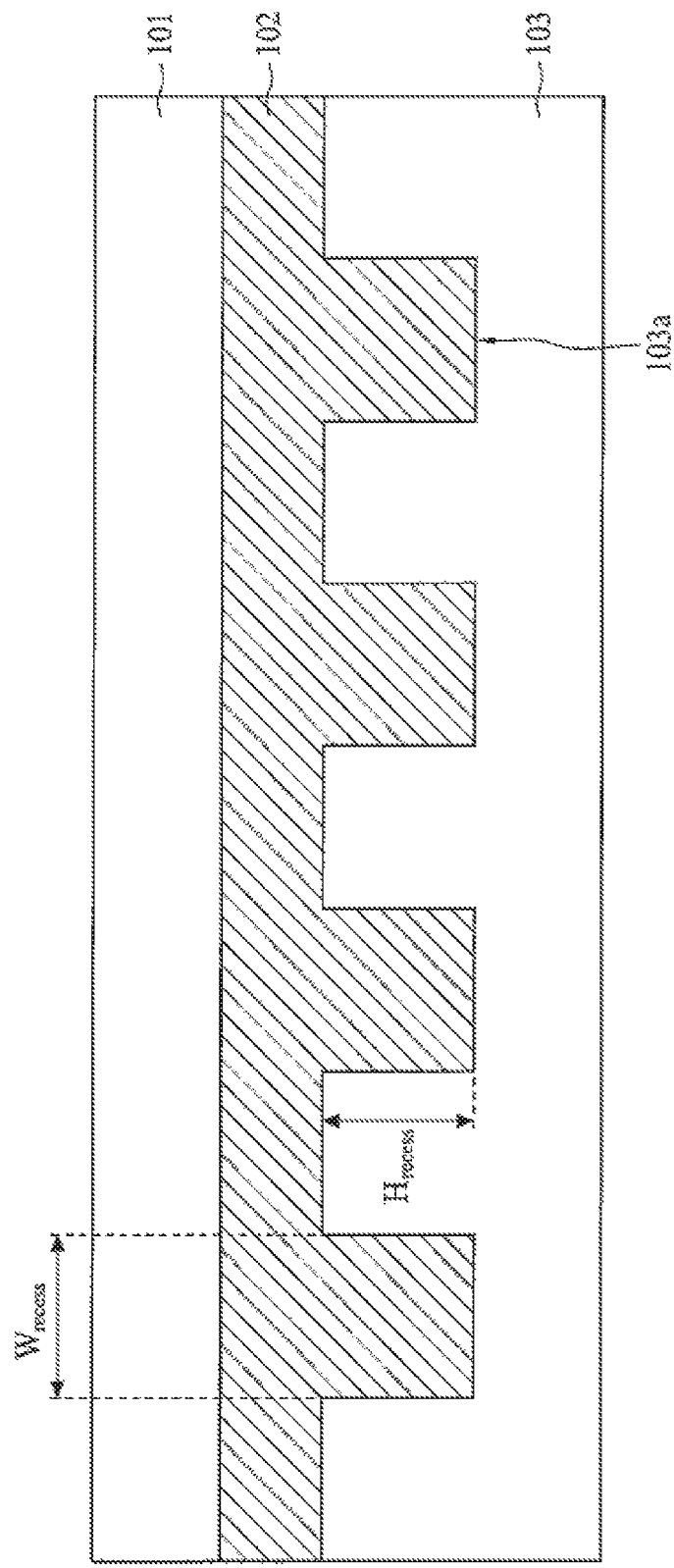

In some embodiments as shown in FIG. 1B, the die 103 includes a recess 103a, and the thermally conductive material 102 disposed between the lid 101 and the die 103 and fills the recess 103a of the die 103. In some embodiments, the recess 103a is indented into the die 103. In some embodiments, a portion of the thermally conductive material 102 is disposed within the recess 103a. In some embodiments, a width $W_{recess}$ of the recess 103a is about 0.2~1 mm. In some embodiments, a height $H_{recess}$ of the recess 103a is about 50 µm to about 150 µm. In some embodiments, the height $H_{recess}$ of the recess 103a is about 100 m.

Figure 1C:
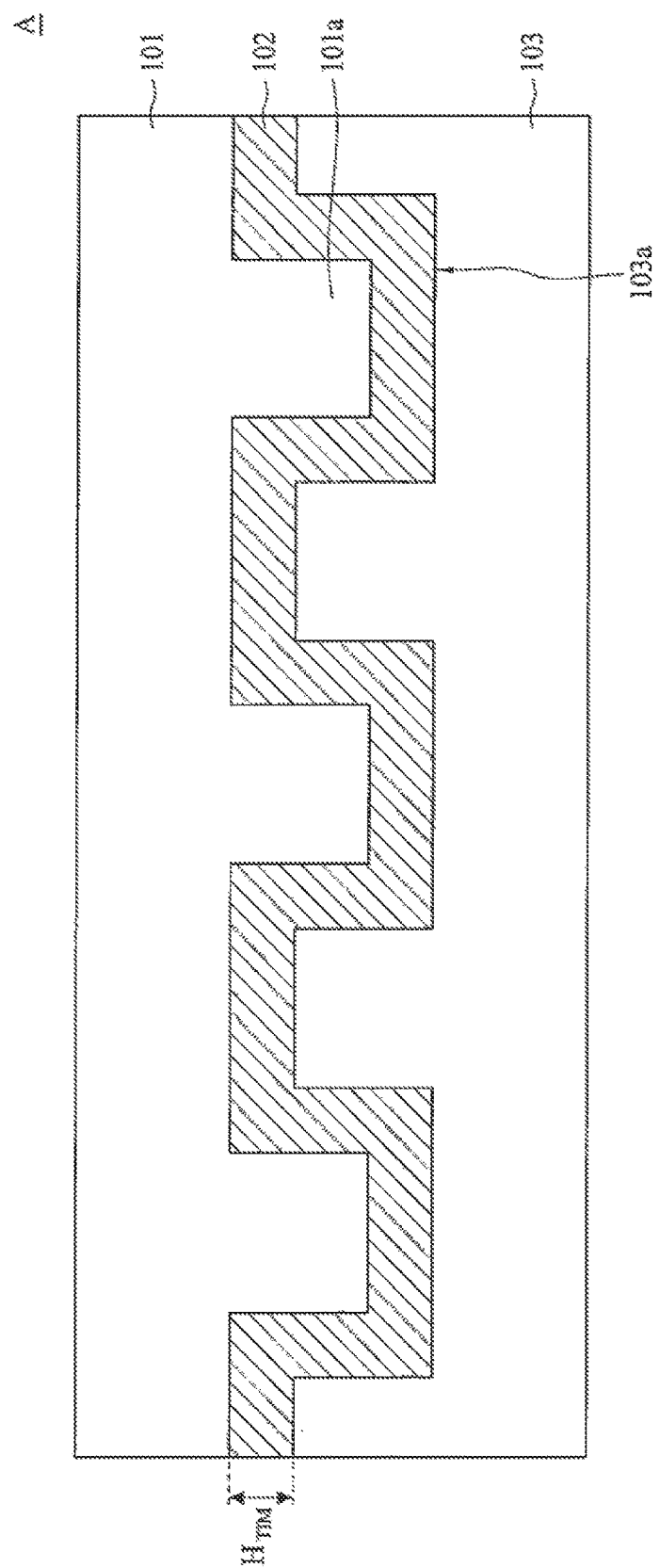

In some embodiments as shown in FIG. 1C, the lid 101 includes the protrusion 101a as described above or illustrated in FIG. 1A, and the die 103 includes the recess 103a as described above or illustrated in FIG. 1B. In some embodiments, at least a portion of the protrusion 101a is disposed within the recess 103a. In some embodiments, the thermally conductive material 102 is disposed between the lid 101 and the die 103 and is conformal to the protrusion 101a and the recess 103a. In some embodiments, the protrusion 101a is conformal to the recess 103a. In some embodiments, a thickness $H_{TIM}$ of the thermally conductive material 102 is about 10 um to about 80 um. In some embodiments, the thickness $H_{TIM}$ is about 20 um to about 80 um. In some embodiments, the thickness $H_{TIM}$ is about 50 µm.

Figure 1D:
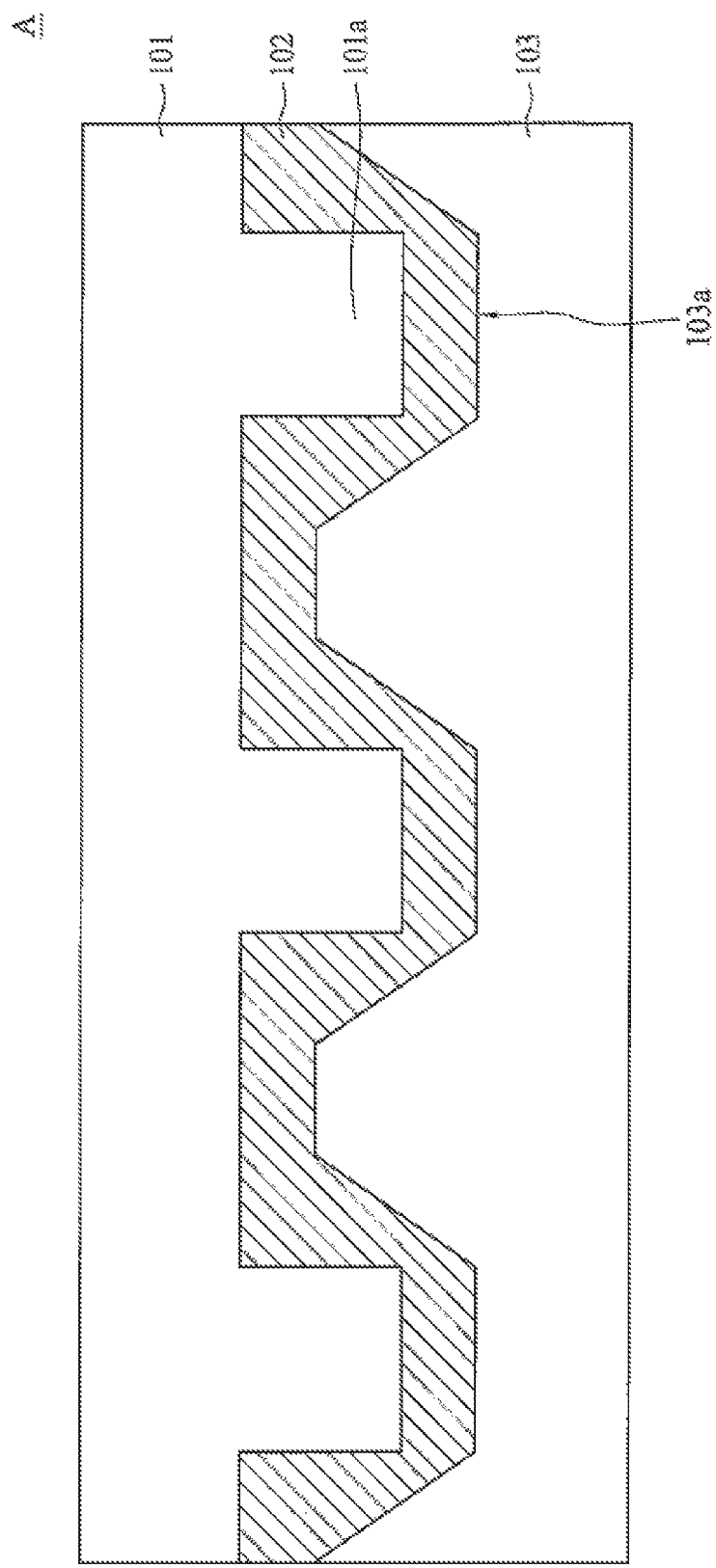

In some embodiments as shown in FIG. 1D, the lid 101 includes the protrusion 101a as described above or illustrated in FIG. 1A, and the die 103 includes the recess 103a in a tapered configuration. In some embodiments, the recess 103a is tapered towards the die 103 and away from the lid 101 or the protrusion 101a.

Figure 1E:
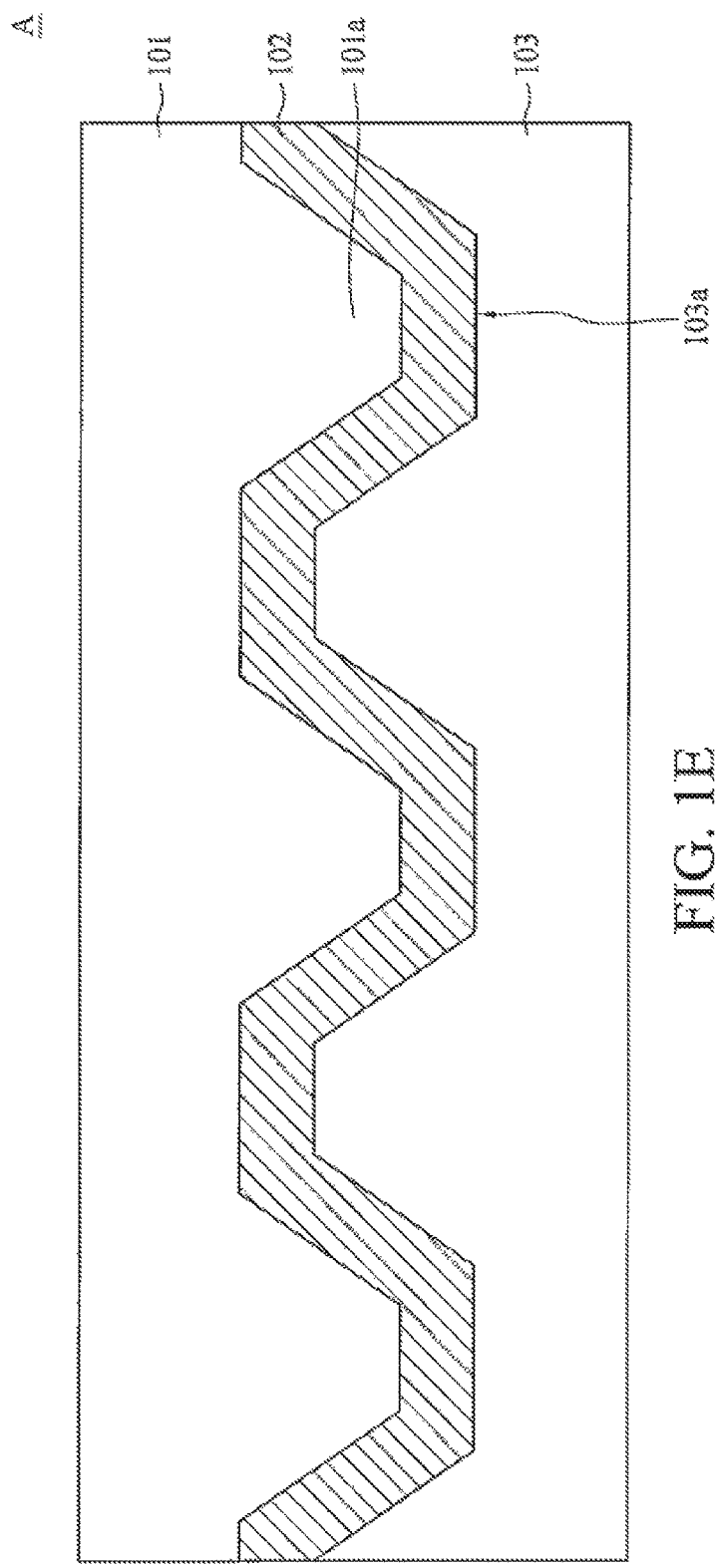

In some embodiments as shown in FIG. 1E, the lid 101 includes the protrusion 101a in a tapered configuration, and the die 103 includes the recess 103a as described above or illustrated in FIG. 1D. In some embodiments, the protrusion 101a is tapered from the lid 101 towards the die 103 or the recess 103a. In some embodiments, the protrusion 101a is complementary or conformal to the recess 103a.

Figure 1F:
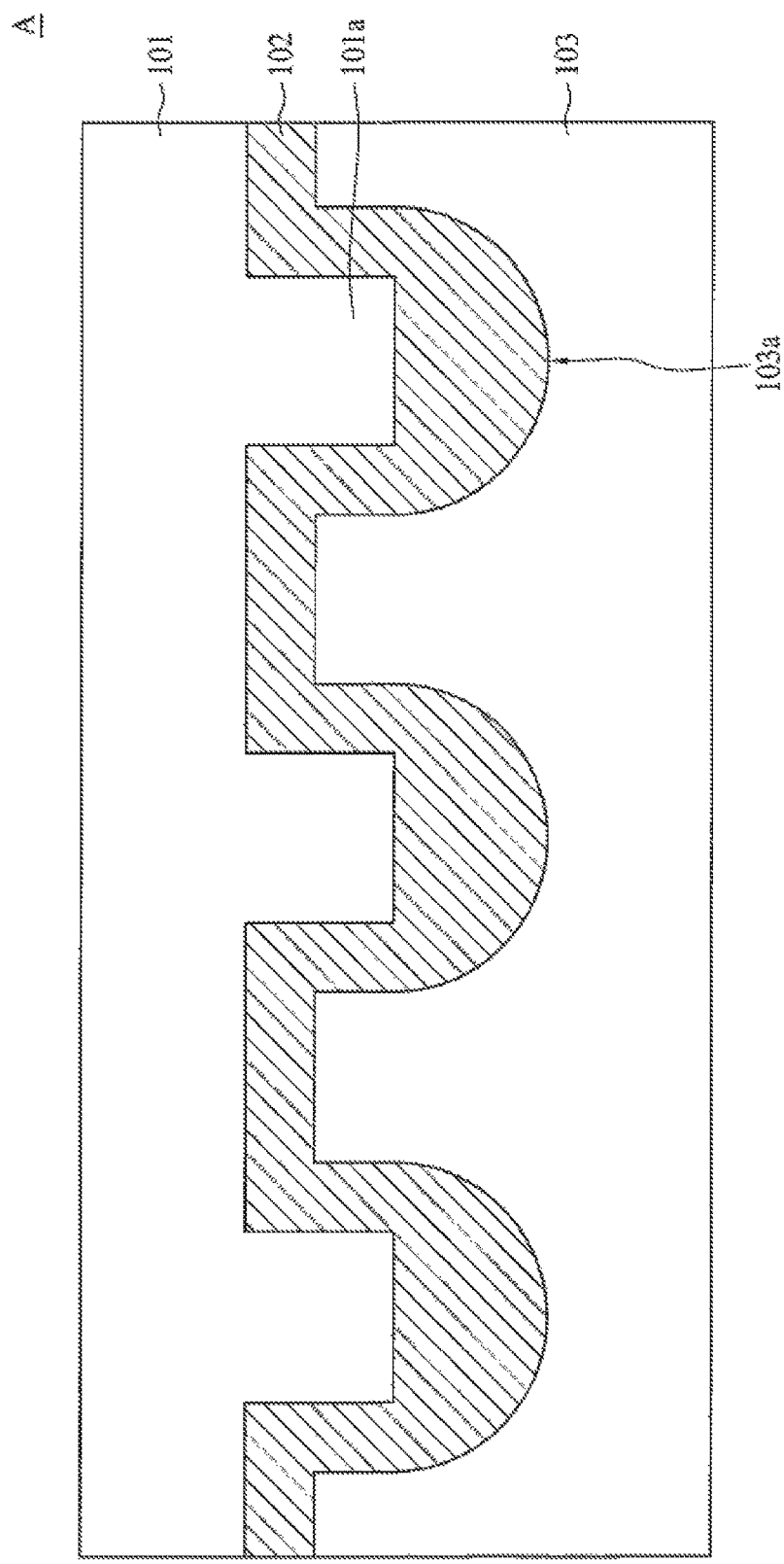

In some embodiments as shown in FIG. 1F, the lid 101 includes the protrusion 101a as described above or illustrated in FIG. 1A, IC or 1D, and the die 103 includes the recess 103a in a round configuration. In some embodiments, the recess 103a of the die 103 includes a semi-circular shape.

Figure 1G:
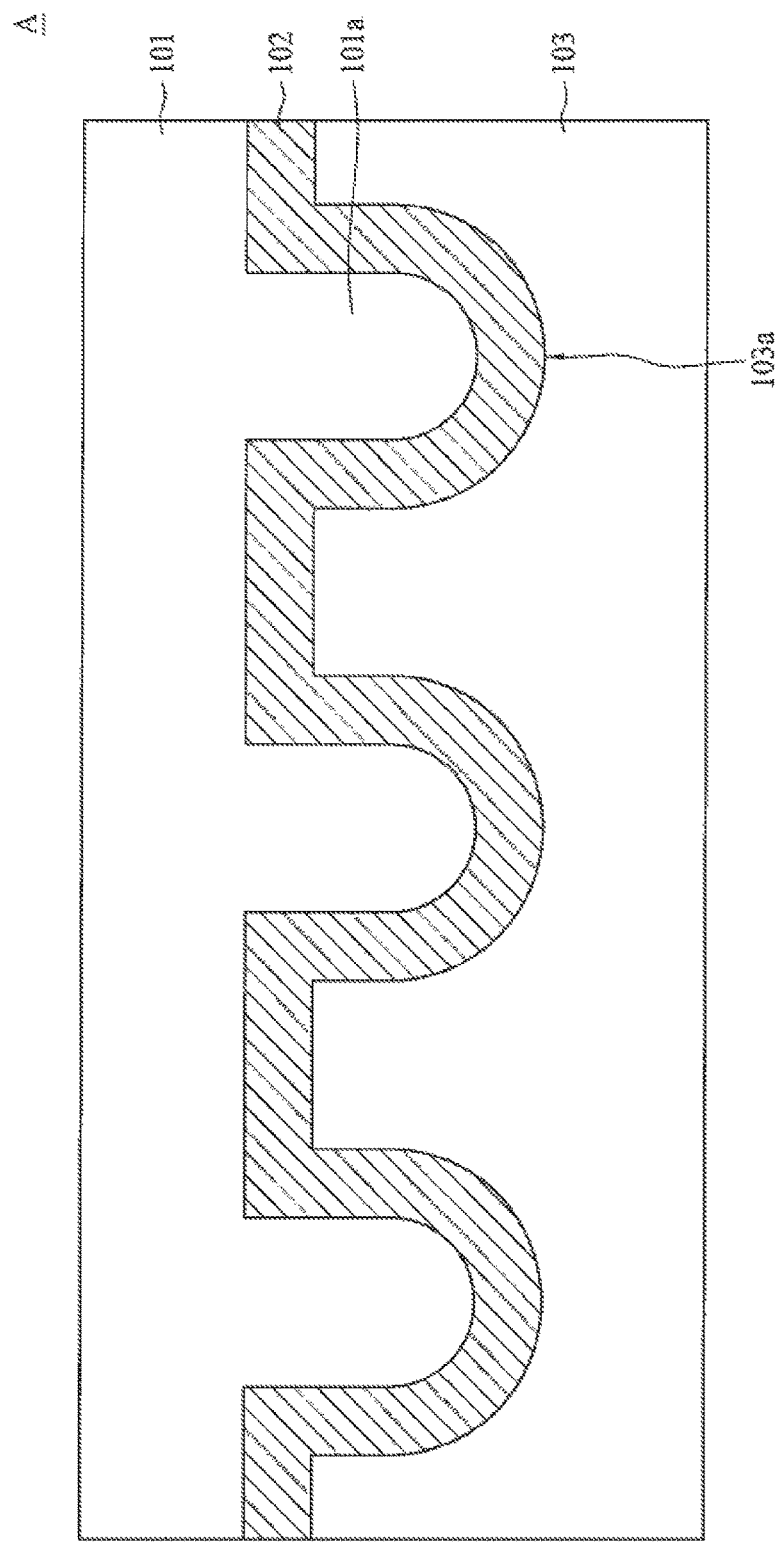

In some embodiments as shown in FIG. 1G, the lid 101 includes the protrusion 101a in a round configuration, and the die 103 includes the recess 103a as described above or illustrated in FIG. 1F. In some embodiments, the protrusion 101a includes a rounded end disposed within the recess 103a. In some embodiments, the protrusion 101a is complementary or conformal to the recess 103a.

Figure 1H:
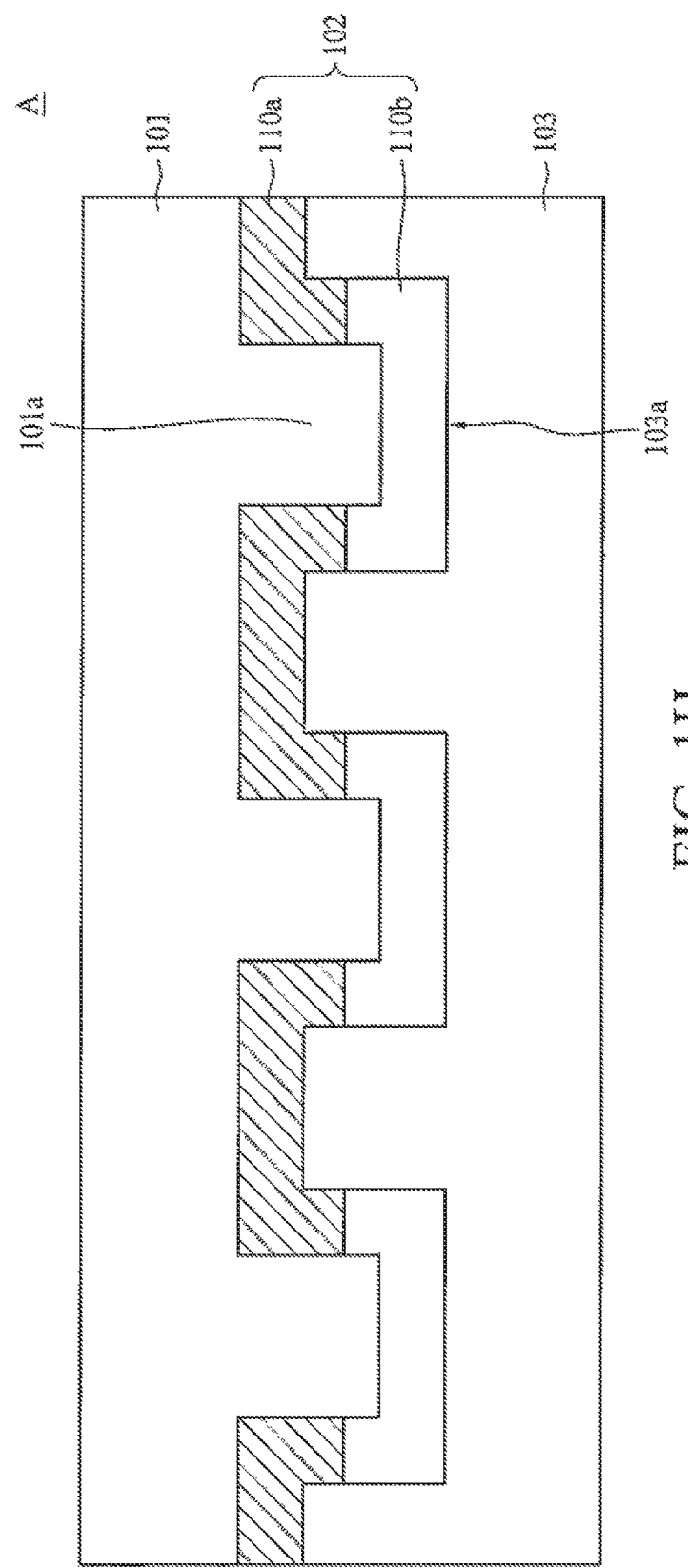

In some embodiments as shown in FIG. 1H, the thermally conductive material 102 includes a combination of an adhesive thermal interface material 110a and a metallic thermal interface material 110b. In some embodiments, the adhesive thermal interface material 110a has better stickiness than the metallic thermal interface material 110b, whereas the metallic thermal interface material 110b has better electrical conductivity than the adhesive thermal interface material 110a. In some embodiments, the adhesive thermal interface material 110a is adjacent to or interfaced with the lid 101, and the metallic thermal interface material 110b is adjacent to or interfaced with the die 103. In some embodiments, the metallic thermal interface material 10a is disposed within the recess 103a of the die 103. In some embodiments, the adhesive thermal interface material 110b surrounds the protrusion 101a of the lid 101.

In some embodiments, such combination of the adhesive thermal interface material 110a and the metallic thermal interface material 110b can allow the lid 101 more securely attached to the die 103, while at the same time a heat generated from the die 103 can transfer towards the lid 101 so as to dissipate the heat out of the semiconductor structure 100 to the surrounding. In some embodiments, the concentration ratio between adhesive thermal interface material 110a and metallic thermal interface material 110b varies depending on a predetermined design specification. For example, the metallic thermal interface material 110b is disposed over a region of the die 103 which generates more heat than another region of the die 103 or is under higher temperature than another region of the die 103. In some embodiments, the adhesive thermal interface material 110a includes polymeric material such as polymer or etc. In some embodiments, the metallic thermal interface material 110b includes metal such as gold, indium or etc.

Figure 2:
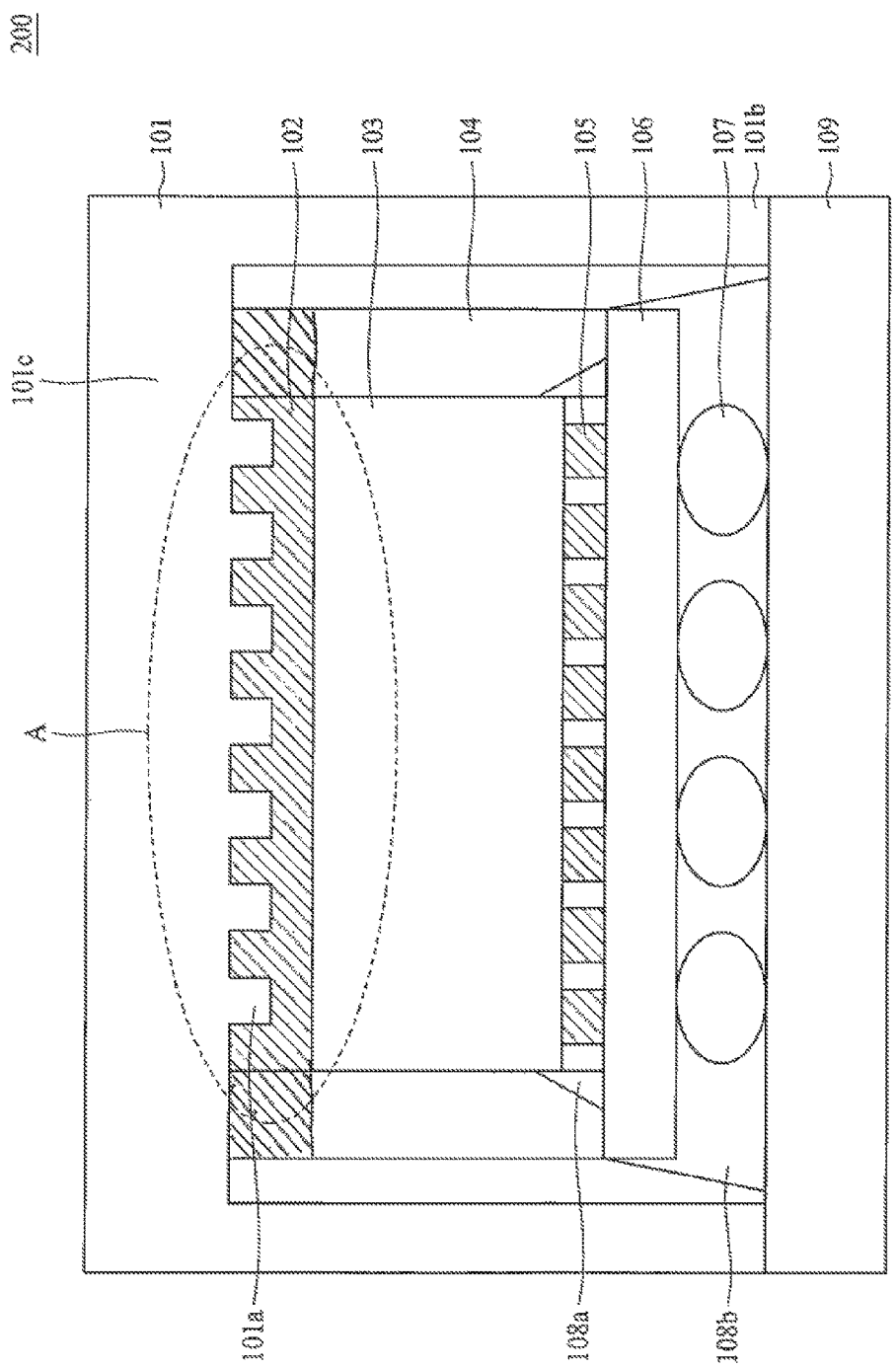
FIG. 2 is a schematic cross-sectional view of another aspect of a semiconductor package in accordance with some embodiments of the present disclosure.

FIG. 2 is another aspect of a semiconductor structure 200. In some embodiments, the semiconductor structure 200 includes a lid 101, a die 103, an interposer 106, a first conductive bump 107 and a substrate 109, which have similar configurations as described above or illustrated in FIG. 1.

In some embodiments, the semiconductor structure 200 includes a thermally conductive material 102 and a molding 104. In some embodiments, the thermally conductive material 102 is disposed between the lid 101 and the die 103. In some embodiments, the thermally conductive material 102 is disposed between the lid 101 and the molding 104. In some embodiments, the molding 104 is not in contact with the lid 101. In some embodiments, the molding 104 surrounds the die 103 and the second conductive bump 105. In some embodiments, a portion A of the semiconductor structure 200 corresponds to the portion A of the semiconductor structure 100 in FIG. 1.

Figure 3:
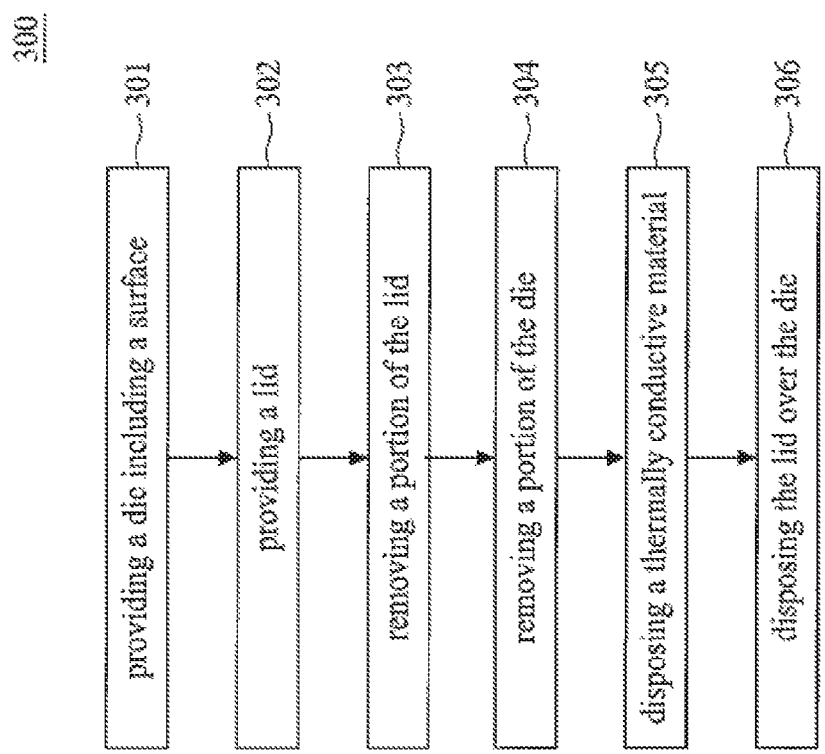
FIG. 3 is a flow diagram of a method of manufacturing a semiconductor structure in accordance with some embodiments of the present disclosure.

FIG. 3 is an embodiment of a method 300 of manufacturing a semiconductor structure (100 or 200). The method 300 includes a number of operations (310, 302, 303, 304, 305, and 306). The operation of the method 300 is not limited to the sequence order represented in accordance to the embodiment as shown in FIG. 3. For instance, operation 310, 302, 303, and 304 can proceed without operation 305 and 306 following after operation 304. In some embodiments, operation 302 precedes operation 301.

Figure 3A:
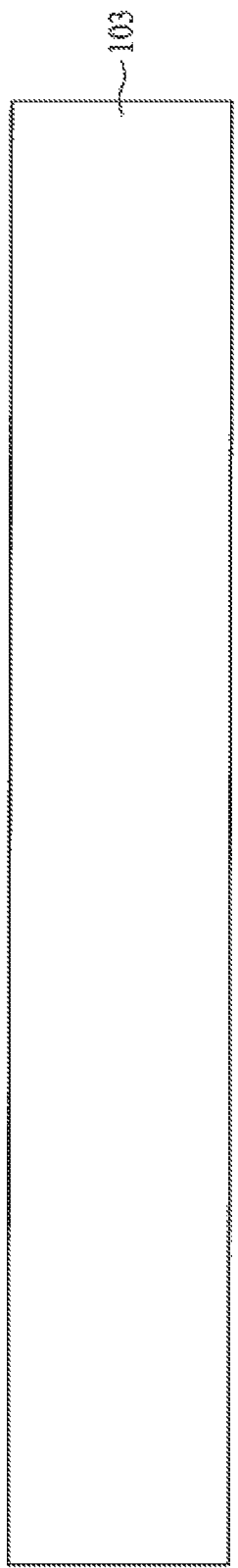
FIGS. 3A-3I are schematic views illustrating manufacturing a semiconductor structure by a method of FIG. 3 in accordance with some embodiments of the present disclosure.

In operation 301, a die 103 including a surface is provided or received as shown in FIG. 3A. In some embodiments, the die 103 has similar configuration as described above or illustrated in any one of FIGS. 1, 1A-1H and 2.

Figure 3B:
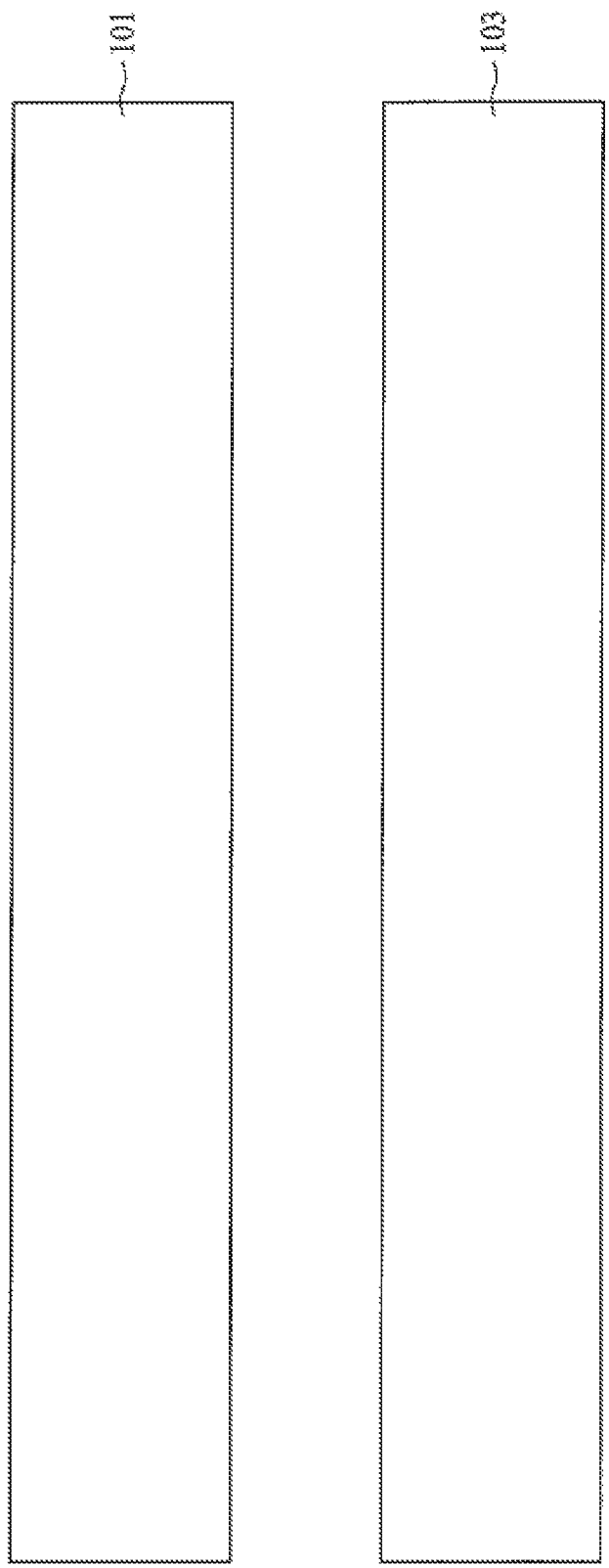

In operation 302, a lid 101 is provided or received as shown in FIG. 3B. In some embodiments, the lid 101 has similar configuration as described above or illustrated in any one of FIGS. 1, 1A-1H and 2.

In some embodiments, the operation 302 can perform prior to the operation 301.

Figure 3C:
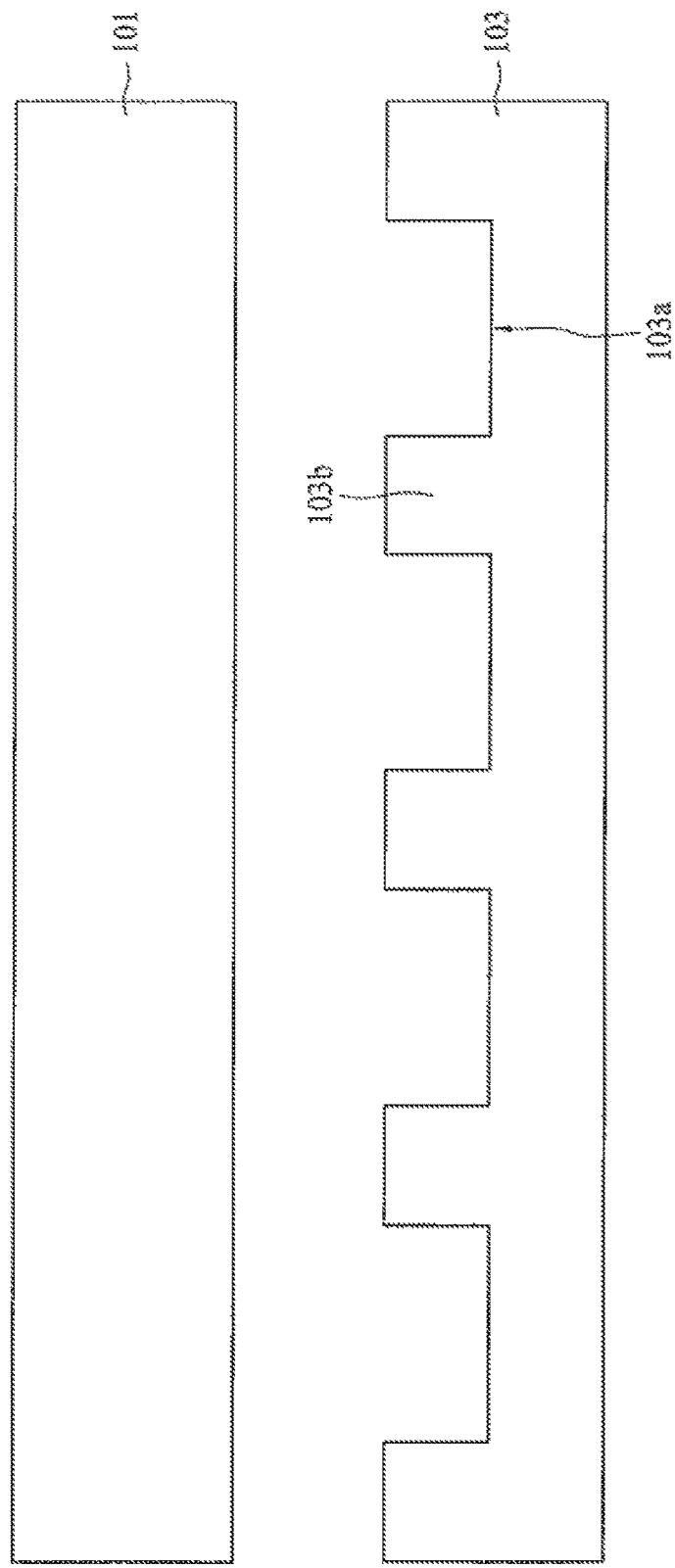

In operation 303, a portion of the die 103 is removed to form a recess 103a as shown in FIG. 3C. In some embodiments, a portion of the lid 101 is removed to form a protrusion 103b. In some embodiments, the portion of the lid 101 is removed to form the recess 103a or the protrusion 103b by wet etching operations, dry etching operations or any other suitable operations.

Figure 3D:
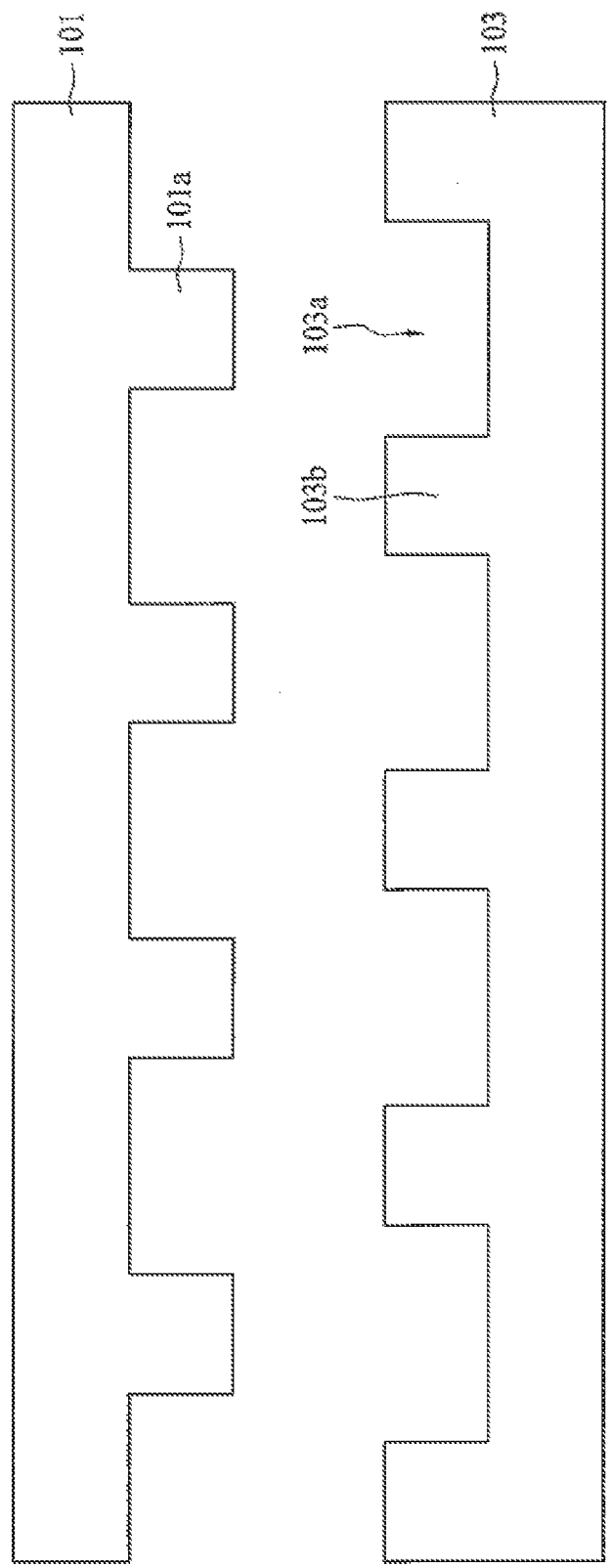

In operation 304, a portion of the lid 101 is removed to form a protrusion 101 as shown in FIG. 3D. In some embodiments, the portion of the lid 101 is removed by mechanical forging operations or any other suitable operations.

Figure 3E:
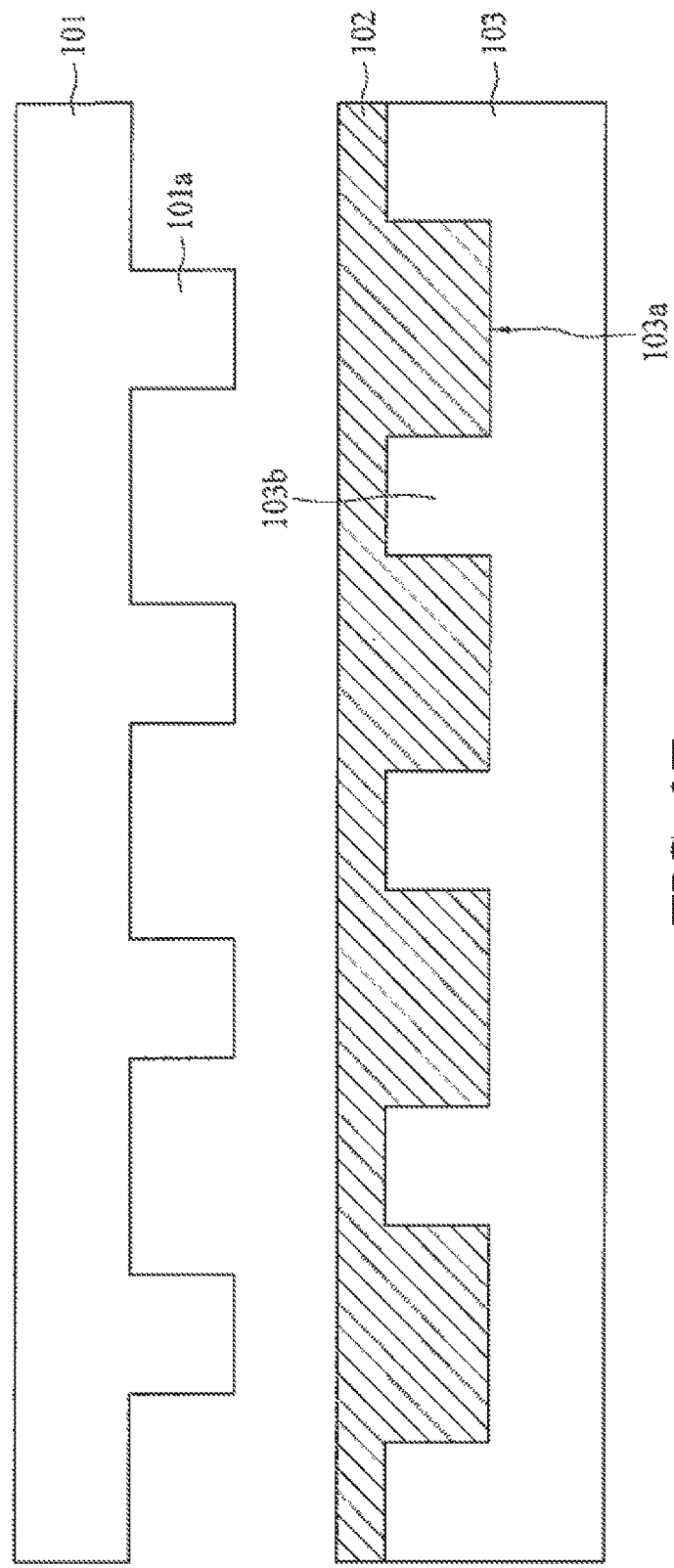

In operation 305, a thermally conductive material 102 is disposed over the die 103 or the lid 101 as shown in FIG. 3E. In some embodiments, the thermally conductive material 102 is disposed between the die 103 and the lid 101. In some embodiments, the thermally conductive material 102 is disposed over a surface of the die 103. In some embodiments, the thermally conductive material 102 is disposed over the surface and within the recess 103a of the die 103. In some embodiments, the thermally conductive material 102 is disposed over a surface of the lid 101. In some embodiments, the thermally conductive material 102 is disposed over the surface and the protrusion 101a of the lid 101.

Figure 3F:
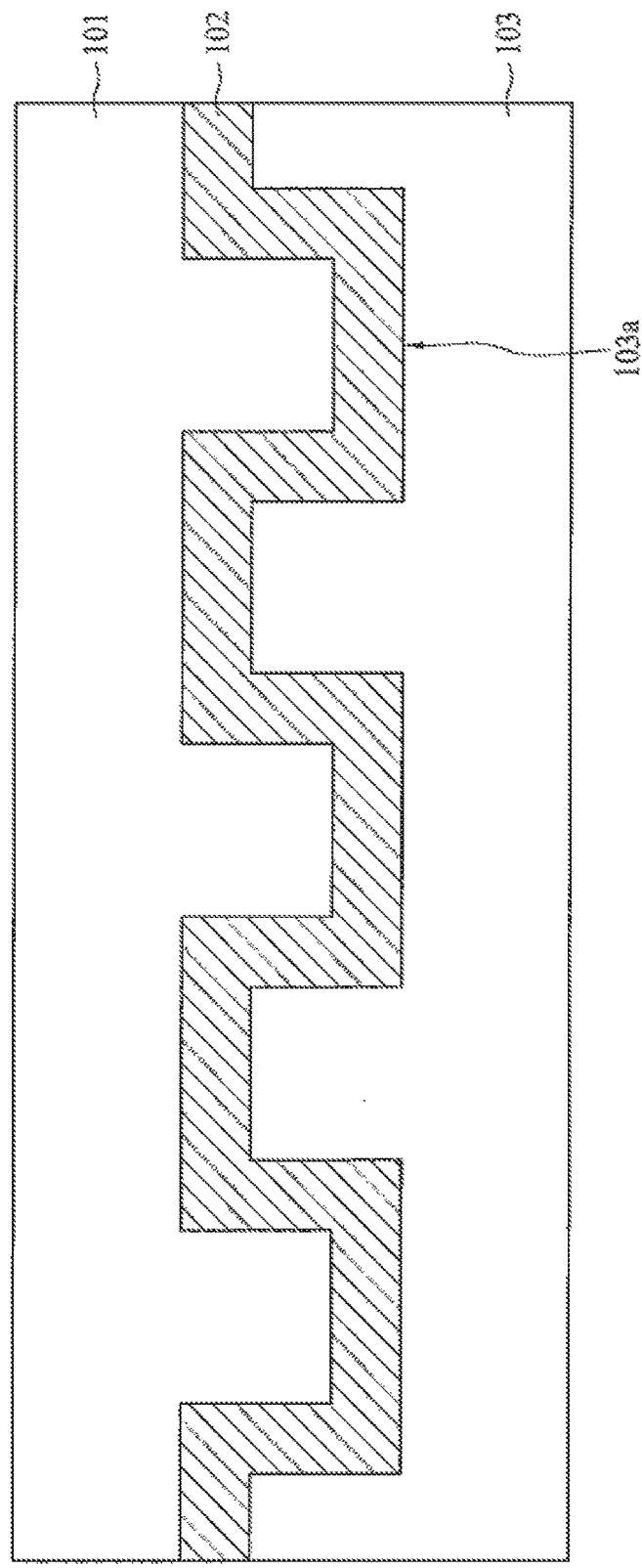

In operation 306, the lid 101 is disposed over the die 103 as shown in FIG. 3F. In some embodiments, the protrusion 101a of the lid 101 is pressed towards the surface of the die 103. In some embodiments, the thermally conductive material 102 is disposed between the lid 101 and the die 103. In some embodiments, the lid 101 is bonded with the die 103 by pressing the lid 101 towards the die 103 or pressing the die 103 towards the lid 101. In some embodiments, the protrusion 101a of the lid 101 is pressed towards the recess 103a of the die 103 and is inserted into the thermally conductive material 102. In some embodiments, the protrusion 101a of the lid 101 is at least partially disposed within the recess 103a of the die 103. In some embodiments, a semiconductor structure as shown in FIG. 1C is formed.

Figure 3G:
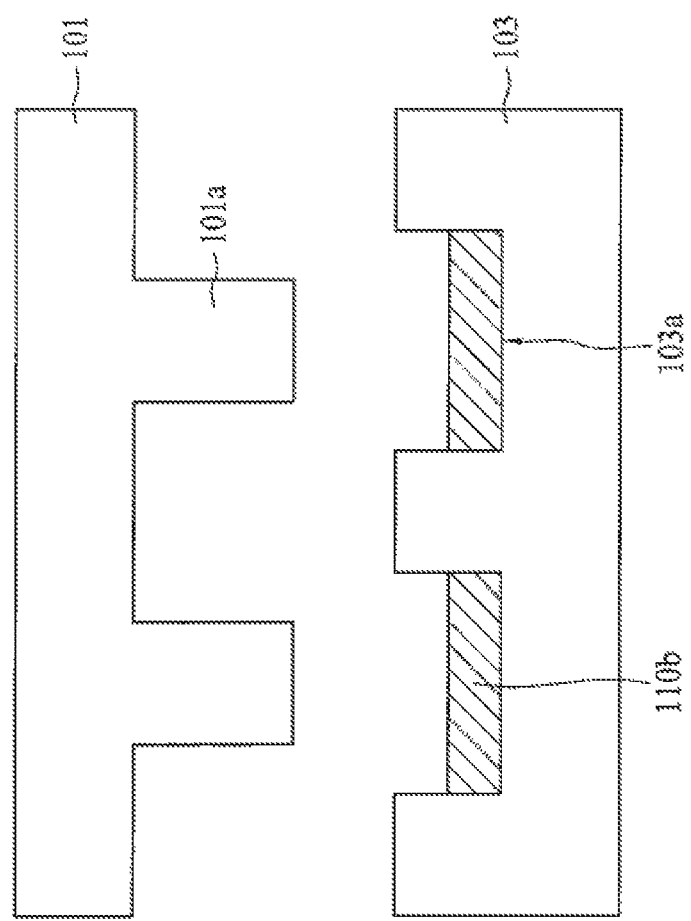
Figure 3H:
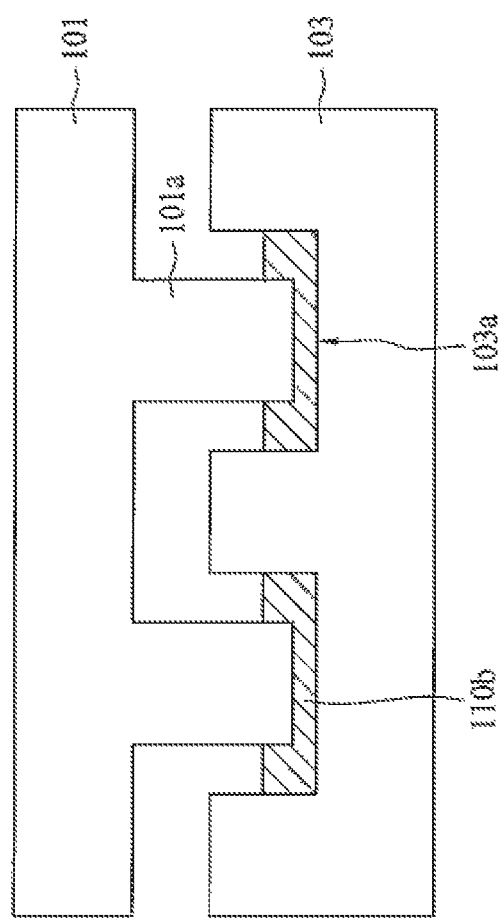
Figure 3I:
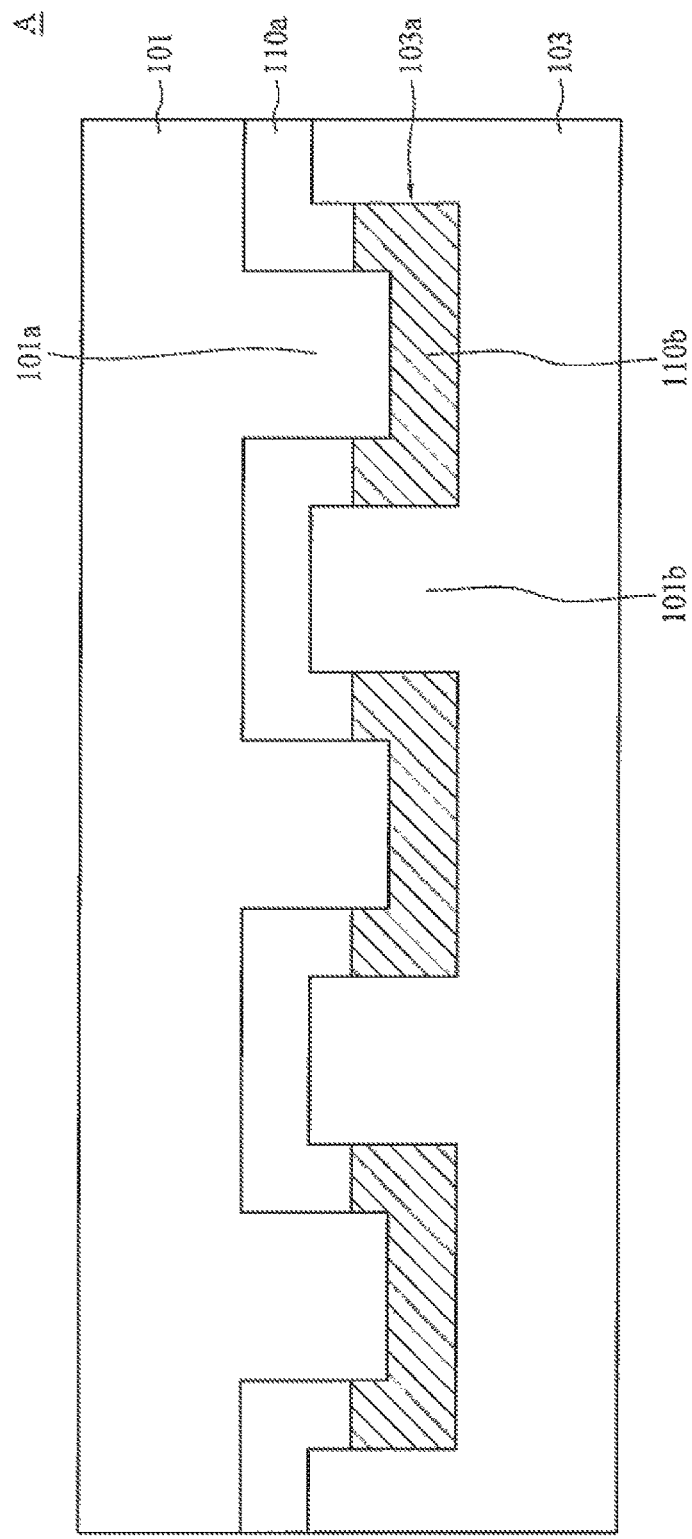

In some embodiments as shown in FIGS. 3G-3I, the operation 105 includes two operations, and the operation 106 is implemented between two operations of the operation 105. In some embodiments, the thermally conductive material 102 includes an adhesive thermal interface material 110a and a metallic thermal interface material 110b. In some embodiments, the operation 105 of disposing the thermal conductive material 102 includes disposing the metallic thermal interface material 110b and disposing the adhesive thermal interface material 110a.

In some embodiments as shown in FIG. 3G, the metallic thermal interface material 110b is disposed within the recess 103a of the die 103 to entirely or partially fill the recess 103a of the die 103.

In some embodiments as shown in FIG. 3H, the lid 101 is disposed over the die 103. In some embodiments, the operation 106 is implemented after the disposing the metallic thermal interface material 110b. In some embodiments, the protrusion 101a of the lid 101 is inserted partially into the metallic thermal interface material 110b. In some embodiments, after the protrusion 101a of the lid 101 is inserted partially into the metallic thermal interface material 110b, a space is formed between the lid 101, the metallic thermal interface material 110b and the die 103.

In some embodiments, as shown in FIG. 3I, after the disposing of the lid 101 over the die 103, the adhesive thermal interface material 110a is disposed between the lid 101, the metallic thermal interface material 110b and the die 103 to fill the space. In some embodiments, the adhesive thermal interface material 110a is disposed adjacent to the lid 101, and the metallic thermal interface material 110b is disposed adjacent to the die 103. In some embodiments, the adhesive thermal interface material 110a surrounds the protrusion 101a of the lid. In some embodiments, a semiconductor structure as shown in FIG. 1H is formed.

In the present disclosure, an apparatus for manufacturing a semiconductor structure is disclosed. The apparatus includes a first clamping member with a first roller, a second clamping member with a second roller. The first clamping member is cooperated with the second clamping member to hold a semiconductor structure such as a substrate between the first clamping member and the second clamping member. The first roller is disposed over a surface of the semiconductor structure, and the second roller is disposed over an opposing surface of the semiconductor structure. As such, the semiconductor structure is movable relative to the first clamping member and the second clamping member. The semiconductor structure can move horizontally. Since the semiconductor structure is movable within the first clamping member and the second clamping member during operations (such as expansion, retraction, heating, cooling, curing, reflow or etc. of the semiconductor structure), warpage or bending of the semiconductor structure can be minimized or prevented.

Figure 4A:
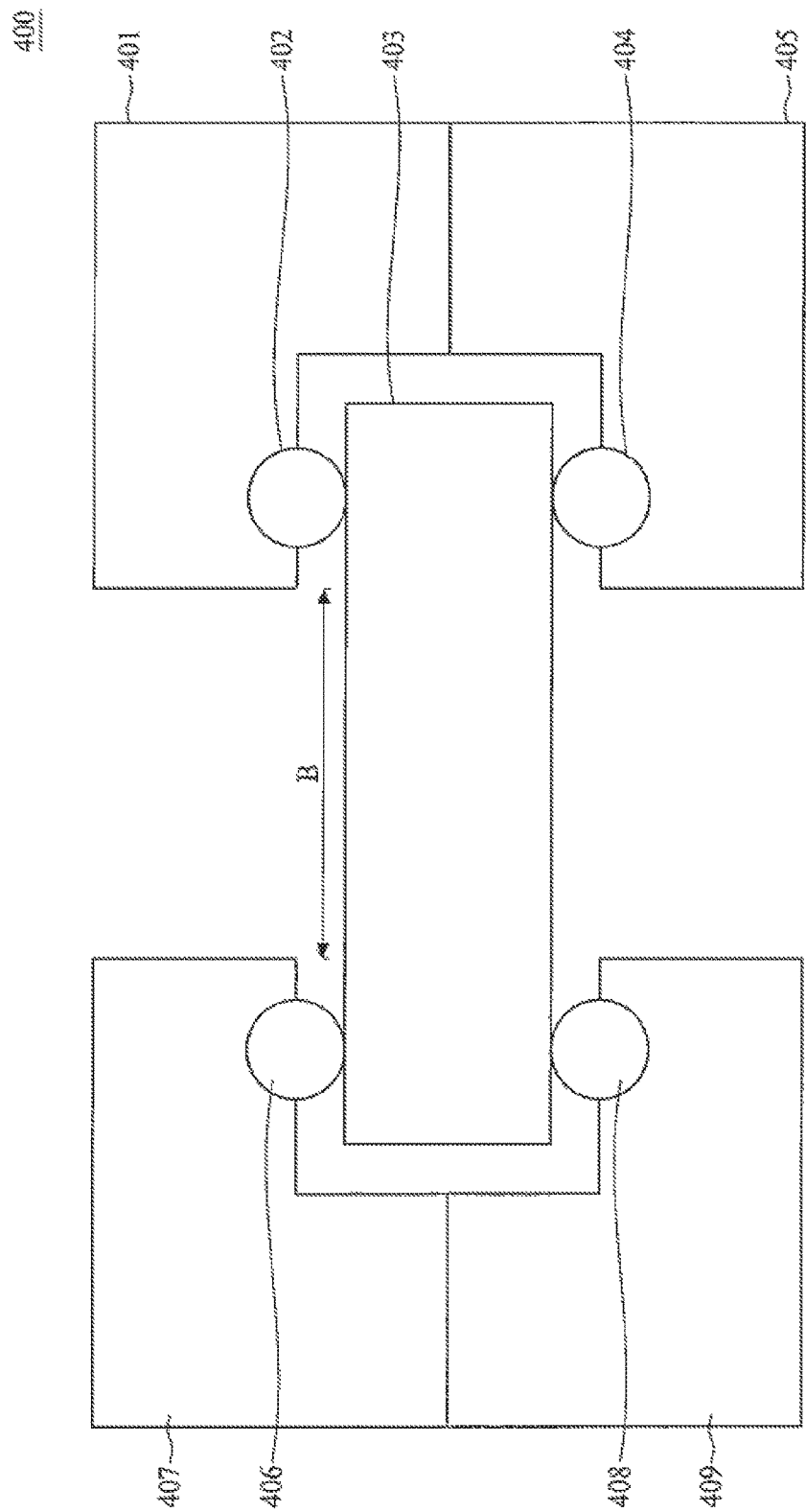
FIG. 4A is a schematic cross-sectional view illustrating an aspect of an apparatus for manufacturing a semiconductor structure in accordance with some embodiment of the present disclosure.

Referring to FIG. 4A, an aspect of an apparatus 400 for manufacturing a semiconductor structure is presented. In some embodiments, the apparatus 400 includes a first clamping member 401, a first roller support 402 disposed over the first clamping member 401 a second clamping member 405 disposed opposite to the first clamping member 401 and a second roller 404 disposed over the second clamping member 405.

In some embodiments, the second clamping member 405 is disposed opposite to the first clamping member 401 and configured to cooperate with the first clamping member 401. In some embodiments, the first clamping member 401 and the second clamping member 405 are configured to cooperate with each other, such that a semiconductor structure 403 such as a substrate, a wafer or the like can be held between the first clamping member 401 and the second clamping member 405. In some embodiments, the first clamping member 401 and the second clamping member 405 are in pairs. In some embodiments, the first clamping member 401 faces the second clamping member 405. In some embodiments, the first clamping member 401 is complementary to the second clamping member 405. In some embodiments, the substrate 403 is clamped by the first clamping member 401 and the second clamping member 405.

In some embodiments, the fist clamping member 401 and the second clamping member 405 are configured to dispose on a predetermined position of the semiconductor structure 403 (such as a periphery or an edge of the semiconductor structure 403) to hold the semiconductor structure 403. In some embodiments, the semiconductor structure 403 is disposed between the first clamping member 401 and the second clamping member 405. In some embodiments, the periphery or the edge of the semiconductor structure 403 is surrounded by the first clamping member 401 and the second clamping member 405.

In some embodiments, the first clamping member 401 is attached to the second clamping member 405. In some embodiments, the first clamping member 401 is attached to the second clamping member 405 by magnetism, adhesive, flux, etc. In some embodiments, the first clamping member 401 and the second clamping member 405 are magnetically attracted to each other, so that the semiconductor structure 403 can be held between the first clamping member 401 and the second clamping member 405.

In some embodiments, the first roller 402 is disposed over and is movable relative to the first clamping member 401. In some embodiments, the second roller 404 is disposed over or movable relative to the second clamping member 405. In some embodiments, the first roller 402 is rotatable relative to the first clamping member 401. In some embodiments, the second roller 404 is rotatable relative to the second clamping member 405. In some embodiments, the first roller 402 is disposed opposite to the second roller 404. In some embodiments, the first roller 402 is vertically aligned with the second roller 404.

In some embodiments, the first roller 402 and the second roller 405 are configured to cooperate with each other, such that the semiconductor structure 403 can be held between the first roller 402 and the second roller 405. In some embodiments, the first roller 402 and the second roller 404 are configured to disposed on the predetermined position of the semiconductor structure 403 (such as a periphery or an edge of the semiconductor structure 403) to hold the semiconductor structure 403. In some embodiments, the first roller 402 is disposed over a surface of the semiconductor structure 403, and the second roller 404 is disposed over an opposing surface of the semiconductor structure 403.

In some embodiments, the semiconductor structure 403 is disposed between the first roller 402 and the second roller 404. In some embodiments, a distance between the first roller support 402 and the second roller support 404 is configured to accommodate a thickness of the substrate 403. In some embodiments, the semiconductor structure 403 is movable relative to the first roller 402 and the second roller 404. In some embodiments, the semiconductor structure 403 is movable, expandable or retractable along a direction parallel to a planar surface of the semiconductor structure 403 (illustrated as an arrow B in FIG. 4A) or horizontal direction. For example, the semiconductor structure 403 can be moved, expanded or retracted during operations such as expansion, retraction, heating, cooling, curing or etc. of the semiconductor structure 403.

In some embodiments, the apparatus 400 includes a third clamping member 407, a third roller 406, a fourth clamping member 409 and a fourth roller 408, which are in similar configuration as the first clamping member 401, the first roller 402, the second clamping member 405 and the second roller 404 respectively. In some embodiments, the semiconductor structure 403 can be held between the third clamping member 407 and the fourth clamping member 409 or between the third roller 406 and the fourth roller 408. In some embodiments, the semiconductor structure 403 is movable relative to the third roller 406 and the fourth roller 408. In some embodiments, the semiconductor structure 403 is movable, expandable or retractable along the direction parallel to the planar surface of the semiconductor structure 403 (illustrated as an arrow B in FIG. 4A) or horizontal direction. In some embodiments, the apparatus 400 can be used before, during or after the semiconductor structure 403 is subjected to operations such as expansion, retraction, heating, cooling, curing or etc. of the semiconductor structure 403.

Figure 4B:
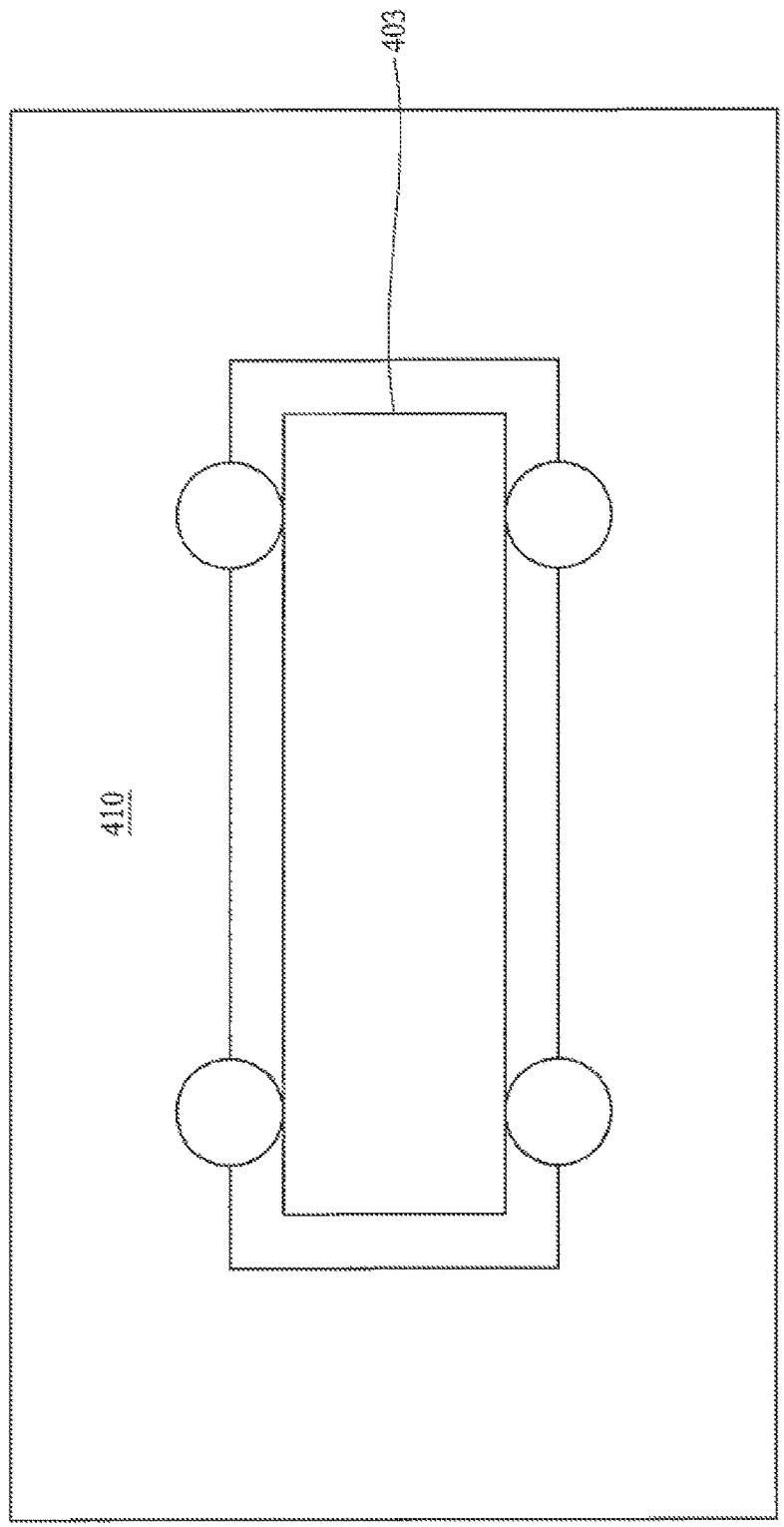
FIG. 4B is a schematic cross-sectional view illustrating another aspect of an apparatus for manufacturing a semiconductor structure in accordance with some embodiment of the present disclosure.

In some embodiments as shown in FIG. 4B, the first clamping member 401, the second clamping member 405, the third clamping member 407 and the fourth clamping member 409 are integrally formed to become a clamping member 410. In some embodiments, the semiconductor structure 403 is held and enclosed by the clamping member 410.

Figure 4C:
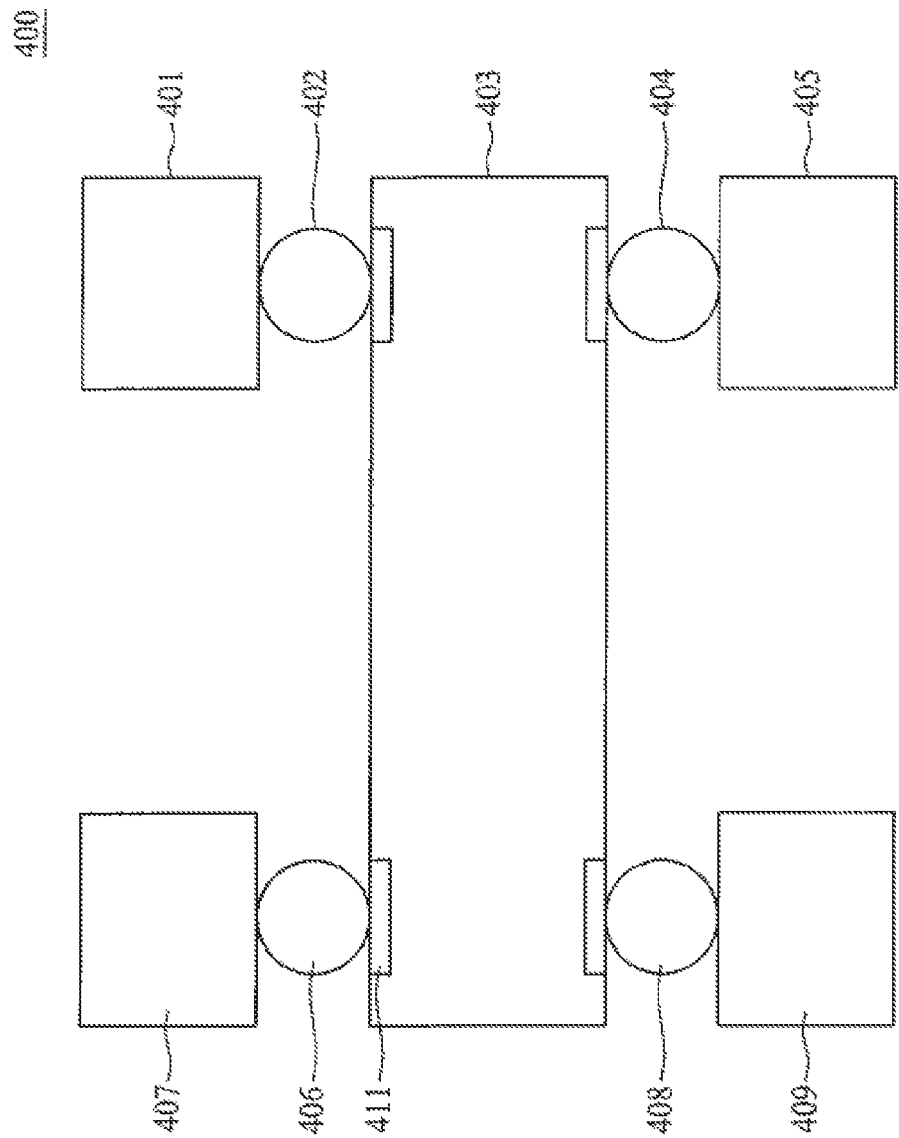
FIG. 4C is a schematic cross-sectional view illustrating yet another aspect of an apparatus for manufacturing a semiconductor structure in accordance with some embodiment of the present disclosure.

Referring to FIG. 4C, yet another aspect of the apparatus 400 for manufacturing a semiconductor structure is presented. In some embodiments, he apparatus 400 is in similar configuration as described above or shown in FIG. 4A. In some embodiments, the first clamping member 401, the second clamping member 405, the third clamping member 407 and the fourth clamping member 409 are separated from each other. In some embodiments, a dummy pad 411 is disposed over the surface of the semiconductor structure 403. In some embodiments, the dummy pad 411 is in contact to the first roller 402, the second roller 404, the third roller 406 or the fourth roller 605. In some embodiments, the dummy pad 411 is configured to facilitate efficient movement, expansion or retraction of the semiconductor structure 403 along the direction parallel to the planar surface of the semiconductor structure 403 or the horizontal direction. In some embodiments, the dummy pad 411 includes conductive material such as copper, aluminum, etc. In some embodiments, a top cross section of the dummy pad 411 is in a rectangular, quadrilateral, polygonal, annular or frame shape.

In some embodiments, the first clamping member 401, the second clamping member 405, the third clamping member 407 and the fourth clamping member 409 are disposed over the edge of the substrate 403. In some embodiments, the first clamping member 401, the second clamping member 405, the third clamping member 407 and the fourth clamping member 409 are disposed over different locations of the edge of the substrate 403 respectively. In some embodiments, the first clamping member 401, the first roller 402, the second roller 404 and the second clamping member 405 are vertically aligned. In some embodiments the third clamping member 407, the third roller 406, the fourth roller 408 and the fourth clamping member 409 are vertically aligned.

Figure 4D:
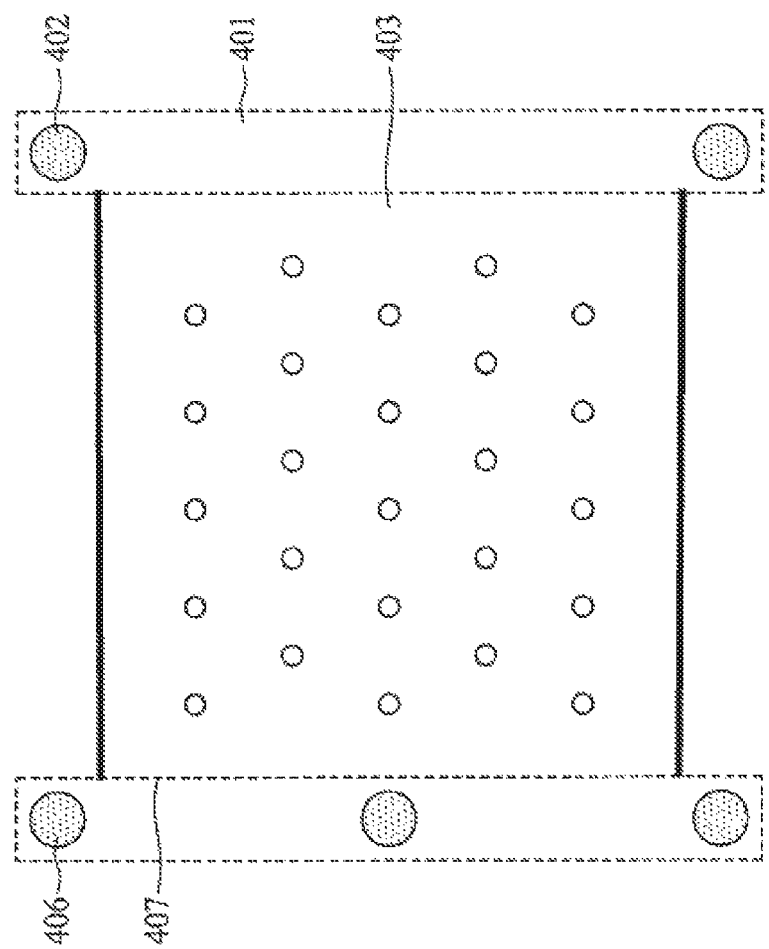
FIG. 4D is a schematic top view of the apparatus in FIG. 4A or 4C in accordance with some embodiment of the present disclosure.

FIG. 4D is a top cross sectional view of the apparatus 400 as shown in FIG. 4A or 4C. In some embodiments, the first clamping member 401 and the third clamping member 407 are disposed over two edges of the semiconductor structure 403. In some embodiments, the first clamping member 401 and the third clamping member 407 are disposed in parallel to each other. In some embodiments, the first clamping member 401 and the third clamping member 407 are in a strip configuration.

Figure 4E:
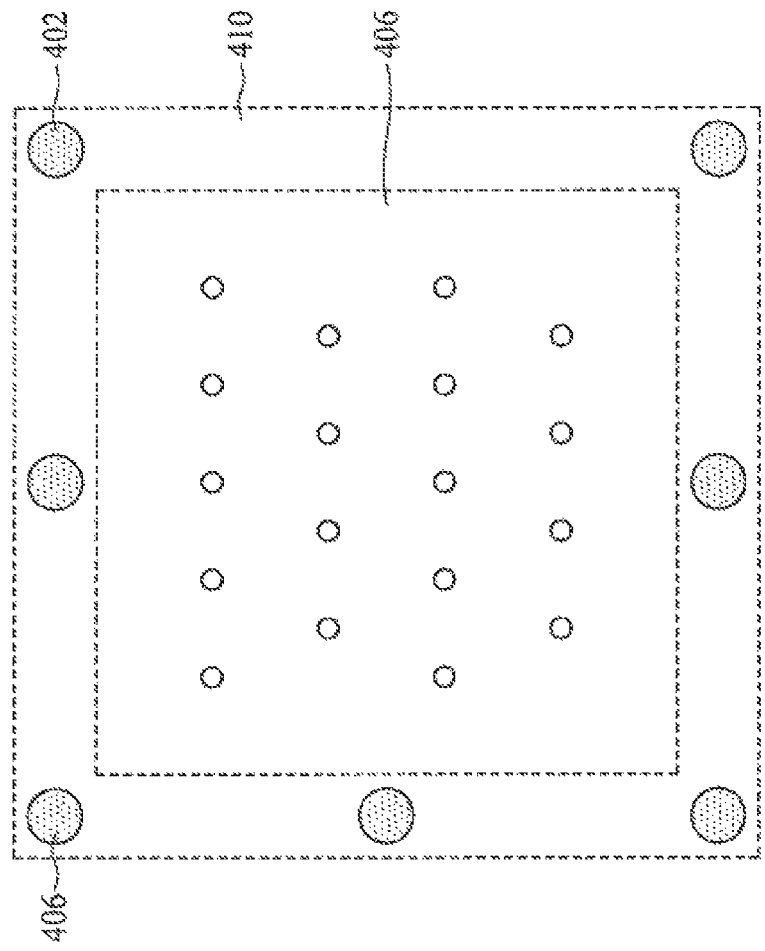
FIG. 4E is a schematic top view of the apparatus in FIG. 4A, 4B or 4C in accordance with some embodiment of the present disclosure.

FIG. 4E is a top cross sectional view of the apparatus 400 as shown in FIG. 4B. In some embodiments, the clamping member 410 is disposed over four edges of the semiconductor structure 403. In some embodiments, the clamping member 410 is in a frame configuration.

Figure 5:
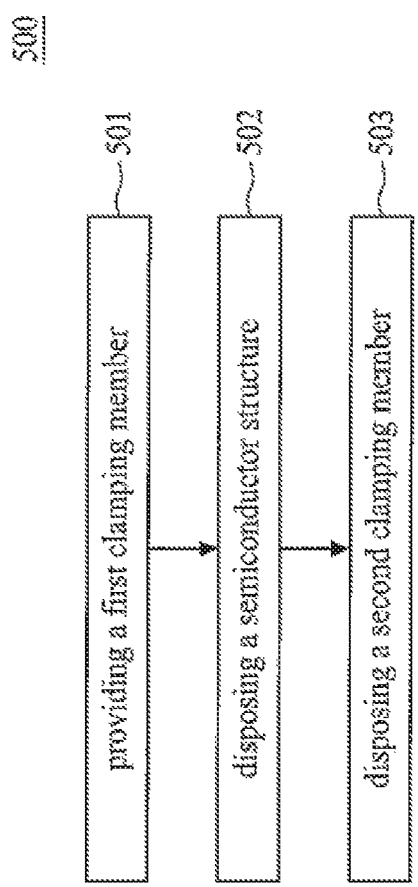
FIG. 5 is a flow diagram of a method of manufacturing a semiconductor structure in accordance with some embodiments of the present disclosure.

FIG. 5 is an embodiment of a method 500 of manufacturing a semiconductor structure. The method 500 includes a number of operations (501, 502 and 503). The operation of the method 500 is not limited to the sequence order represented in accordance to the embodiment as shown in FIG. 5.

In operation 501, a first clamping member 401 including a first roller 402 is provided or received as shown in FIG. 6A. In some embodiments, the first roller 402 is disposed over the first clamping member 401.

Figure 6B:
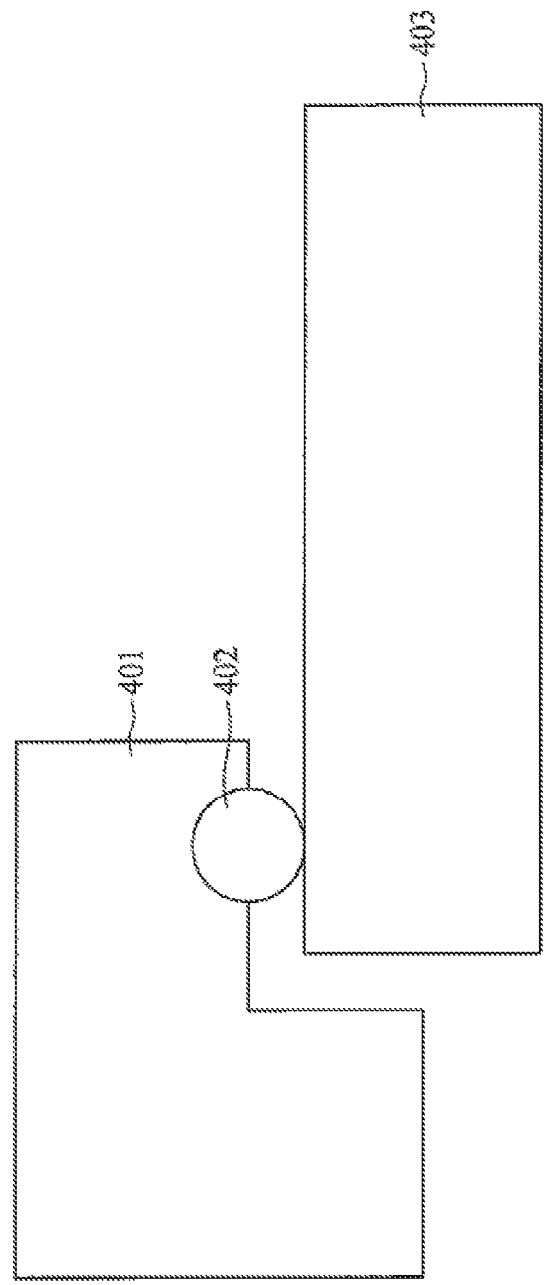

In operation 502, a semiconductor structure 403 is provided and disposed over the first roller 402 and the first clamping member 401 as shown in FIG. 6B. In some embodiments, the first clamping member 401 or the first roller 402 is disposed over a surface or an edge of the semiconductor structure 403. In some embodiments, the first roller 402 is in contact to the surface or the edge of the semiconductor structure 403.

Figure 6C:
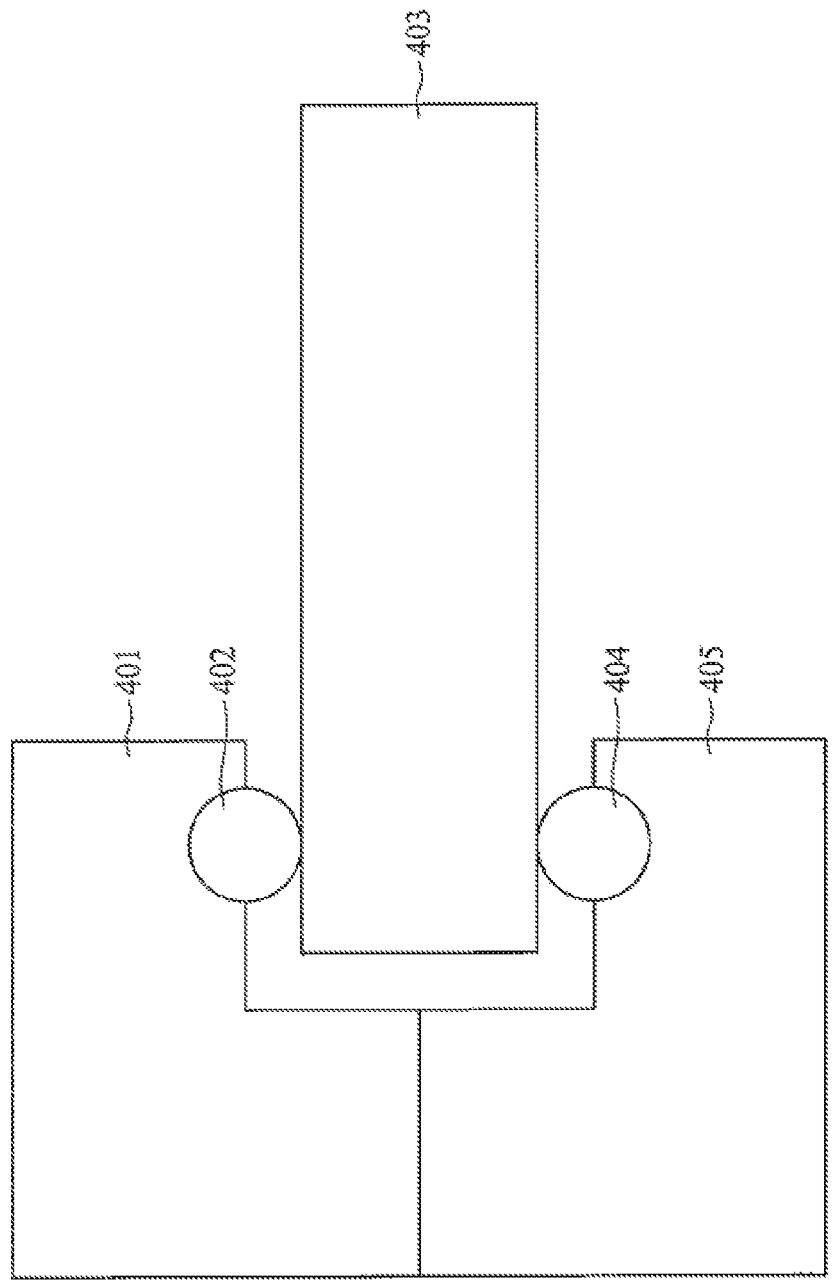

In operation 503, a second clamping member 405 including a second roller support 404 is provided and disposed over the semiconductor structure 403 as shown in FIG. 6C. In some embodiments, the second clamping member 405 is disposed opposite to the first clamping member 401 and over an opposing surface or an edge of the semiconductor structure 403. In some embodiments, the second roller 404 is in contact to the opposing surface or the edge of the semiconductor structure 403. In some embodiments, the first clamping member 401 is cooperated with the second clamping member 405 to hold the semiconductor structure 403. In some embodiments, the first roller 402 and the second roller 404 are disposed over the surface and the opposing surface of the semiconductor structure 403 respectively, so as to hold the semiconductor structure 403 between the first clamping member 401 and the second clamping member 405 or between the first roller 402 and the second roller 404. In some embodiments, the semiconductor structure 403 can be held between the first clamping member 401 and the second clamping member 405. In some embodiments, the semiconductor structure 403 can be held between the first roller 402 and the second roller 404.

Figure 6D:
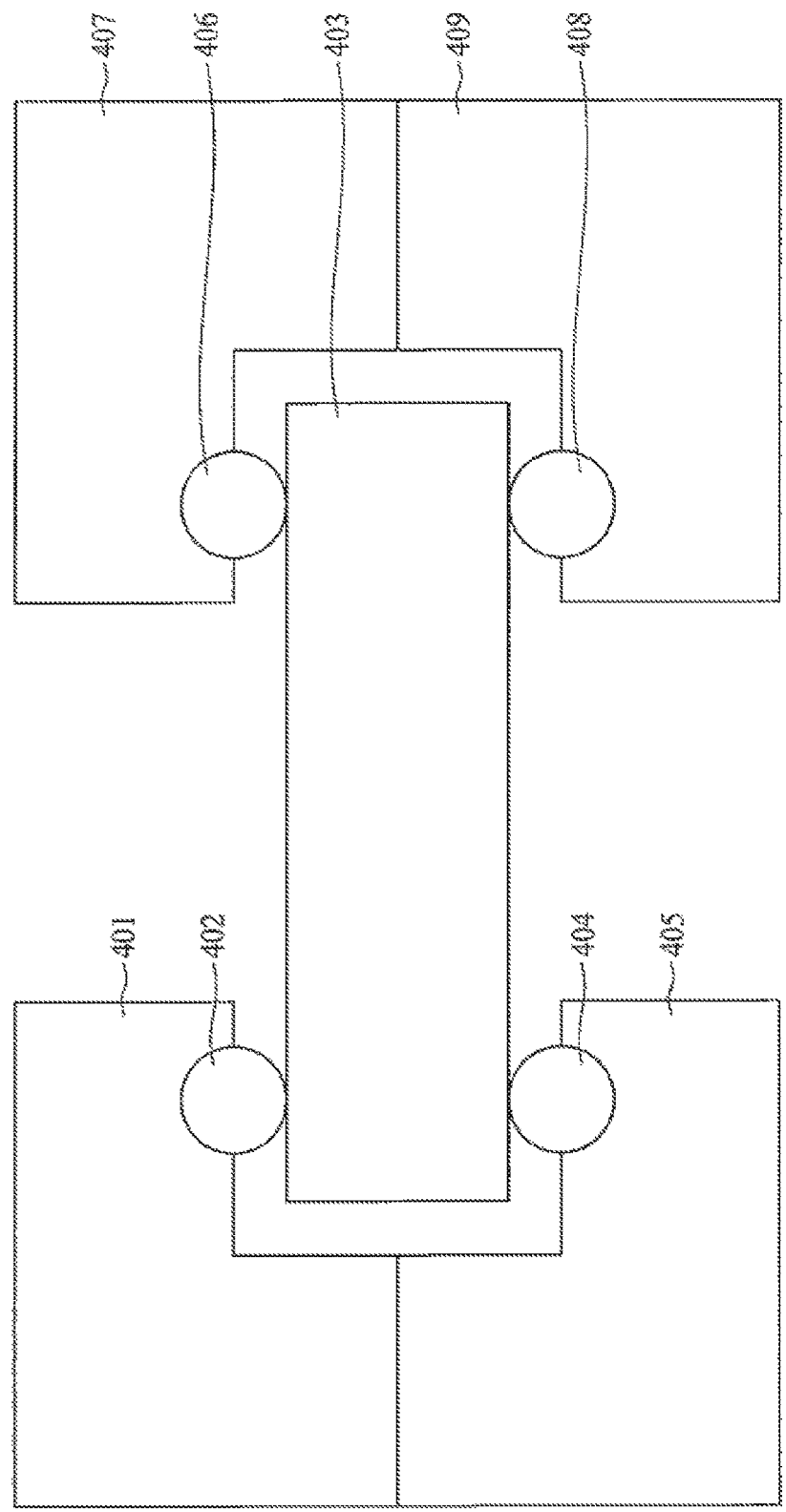

In some embodiments, a third clamping member 407, a third roller 406, a fourth clamping member 409 and a fourth roller 408 are provided as shown in FIG. 6D. In some embodiments, the third clamping member 407, the third roller 406, the fourth clamping member 409 and the fourth roller 408 are disposed over the surfaces or the edge of the semiconductor structure 403 in a similar way as the disposing of the first clamping member 401, the first roller 402, the second clamping member 405 and the second roller 404 as shown in FIG. 6C.

In some embodiments, a semiconductor structure comprises a die including a surface, a lid disposed over the surface of the die, and a thermally conductive material disposed between the die and the lid, wherein the lid includes a protrusion protruded towards the surface of the die and the thermally conductive material surrounds the protrusion.

In some embodiments, the die includes a recess over the surface and surrounds at least a portion of the protrusion of the lid. In some embodiments, the protrusion is complementary to the recess. In some embodiments, the protrusion has a width between about 0.1 mm and about 1.5 mm, or has a height between about 50 µm to about 150 µm. In some embodiments, the recess has a height of about 50 µm to about 150 µm. In some embodiments, a thickness of the thermally conductive material is about 20 µm to about 80 µm. In some embodiments, the semiconductor structure further comprises a molding surrounding the die, wherein the thermally conductive material and the lid are disposed over the molding. In some embodiments, the thermally conductive material is an adhesive, or includes polymeric or metallic material. In some embodiments, the semiconductor structure further comprises a substrate and a conductive bump bonding the die with the substrate.

In some embodiments, a method of manufacturing a semiconductor structure comprises providing a die including a surface, providing a lid, removing a portion of the lid to form a protrusion, and disposing a thermally conductive material between the surface of the die and the lid, wherein the protrusion of the lid is surrounded by the thermally conductive material.

In some embodiments, the method further comprises removing a portion of the die to form a recess over the surface. In some embodiments, the removing the portion for the lid includes mechanical forming operations. In some embodiments, the removing the portion of the die includes wet etching operations or dry etching operations. In some embodiments, the protrusion of the lid is at least partially disposed within the recess of the die. In some embodiments, the method further comprises inserting the protrusion of the lid into the thermally conductive material.

In some embodiments, an apparatus for manufacturing a semiconductor structure comprises a first clamping member; a second clamping member disposed opposite to the first clamping member and configured to cooperate with the first clamping member; a first roller disposed over the first clamping member; and a second roller disposed over the second clamping member and opposite to the first roller, wherein the first clamping member and the second clamping member are configured to dispose on a predetermined position of a semiconductor structure, and the semiconductor structure is movable relative to the first clamping member and the second clamping member.

In some embodiments, the predetermined position is a periphery or an edge the semiconductor structure. In some embodiments, the first clamping member and the second clamping member are configured to hold the semiconductor structure between the first clamping member and the second clamping member. In some embodiments, the first clamping member is magnetically attractable to the second clamping member. In some embodiments, the semiconductor structure is a substrate or a wafer. In some embodiments, the method further includes a third clamping member having a third roller and a fourth clamping member having a fourth roller, wherein the third clamping member and the fourth clamping member are configured to dispose on the predetermined position of the semiconductor structure, and the semiconductor structure is movable relative to the third clamping member and the fourth clamping member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departs from the spirit and scope of the present disclosure.

What is claimed is:

1. A semiconductor structure, comprising:
   a die including a surface;
   a lid disposed over the surface of the die; and
   a thermally conductive material disposed between the die and the lid, wherein the lid includes a protrusion protruded towards the surface of the die, the thermally conductive material surrounds the protrusion, the die includes a recess over the surface and surrounds at least a portion of the protrusion of the lid.

2. The semiconductor structure of claim 1, wherein the protrusion is complementary to the recess.

3. The semiconductor structure of claim 1, wherein the protrusion has a width between about 0.1 mm and about 1.5 mm, or has a height between about 50μm to about 150μm.

4. The semiconductor structure of claim 1, wherein the recess has a height of about 50μm to about 150μm.

5. The semiconductor structure of claim 1, wherein a thickness of the thermally conductive material is about 10μm to about 80μm.

6. The semiconductor structure of claim 1, further comprising a molding surrounding the die, wherein the thermally conductive material and the lid are disposed over the molding.

7. The semiconductor structure of claim 1, wherein the thermally conductive material is an adhesive, or includes polymeric or metallic material.

8. The semiconductor structure of claim 1, further comprising a substrate and a conductive bump bonding the die with the substrate.

9. A method of manufacturing a semiconductor structure, comprising:
   providing a die including a surface;
   providing a lid;
   removing a portion of the lid to form a protrusion;
   removing a portion of the die to form a recess over the surface; and
   disposing a thermally conductive material between the surface of the die and the lid, wherein the protrusion of the lid is surrounded by the thermally conductive material.

10. The method of claim 9, wherein the removing the portion of the lid includes mechanical forging operations, or the removing the portion of the die includes wet etching operations or dry etching operations.

11. The method of claim 9, wherein the protrusion of the lid is at least partially disposed within the recess of the die.

12. The method of claim 9, further comprising inserting the protrusion of the lid into the thermally conductive material.

13. The semiconductor structure of claim 1, wherein the thermally conductive material includes a combination of an adhesive thermal interface material and a metallic thermal interface material.

14. The semiconductor structure of claim 1, wherein the lid comprises a ring member surrounding the die and a covering member disposed over the die and the ring member.

15. The semiconductor structure of claim 1, wherein a width of the recess of the die is greater than a width of the protrusion of the lid.

16. A semiconductor structure, comprising:
   a die;
   a lid disposed over the die; and
   a thermally conductive material disposed between the die and the lid, wherein the lid includes a plurality first protrusions protruded towards the die, the die includes a plurality of second protrusions protruded towards the lid, the first protrusions and the second protrusions are alternately arranged, and the thermally conductive material surrounds the first protrusions and the second protrusions.

17. The semiconductor structure of claim 16, wherein a thickness of the thermally conductive material between the first protrusions and the second protrusions is consistent.

18. The semiconductor structure of claim 16, wherein a thickness of the thermally conductive material between the first protrusions and the second protrusions is inconsistent.

19. The semiconductor structure of claim 1, wherein the a thickness of the thermally conductive material between the protrusion of the lid and the recess of the die is consistent.

20. The semiconductor structure of claim 1, wherein the a thickness of the thermally conductive material between the protrusion of the lid and the recess of the die is inconsistent.

* * * * *